(12) United States Patent
Mitomo et al.

(10) Patent No.: US 11,011,888 B2
(45) Date of Patent: May 18, 2021

(54) LIGHT-EMITTING DEVICE AND LIGHT-EMITTING APPARATUS

(71) Applicant: SONY CORPORATION, Tokyo (JP)

(72) Inventors: Jugo Mitomo, Kanagawa (JP); Tatsushi Hamaguchi, Kanagawa (JP); Hiroshi Nakajima, Kanagawa (JP); Masamichi Ito, Miyagi (JP); Susumu Sato, Kanagawa (JP); Hidekazu Kawanishi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/490,369

(22) PCT Filed: Mar. 5, 2018

(86) PCT No.: PCT/JP2018/008234
§ 371 (c)(1),
(2) Date: Aug. 30, 2019

(87) PCT Pub. No.: WO2018/190030
PCT Pub. Date: Oct. 18, 2018

(65) Prior Publication Data
US 2020/0028325 A1    Jan. 23, 2020

(30) Foreign Application Priority Data

Apr. 14, 2017   (JP) .............................. JP2017-080354

(51) Int. Cl.
*H01S 5/183* (2006.01)
*H01S 5/024* (2006.01)
(Continued)

(52) U.S. Cl.
CPC ...... *H01S 5/18302* (2013.01); *H01S 5/02469* (2013.01); *H01S 5/18305* (2013.01);
(Continued)

(58) Field of Classification Search
CPC ............. H01S 5/18302; H01S 5/02469; H01S 5/18305; H01S 5/18308; H01S 5/18361;
(Continued)

(56) References Cited

U.S. PATENT DOCUMENTS

2002/0105988 A1   8/2002  Park et al.
2010/0303468 A1   12/2010 Mastro et al.

FOREIGN PATENT DOCUMENTS

CN          1369940 A      9/2002
EP          1233493 A2     8/2002
(Continued)

OTHER PUBLICATIONS

International Search Report and Written Opinion of PCT Application No. PCT/JP2018/008234, dated Apr. 24, 2018, 08 pages of ISRWO.

*Primary Examiner* — Armando Rodriguez
(74) *Attorney, Agent, or Firm* — Chip Law Group

(57) ABSTRACT

A light-emitting device according to an embodiment of the present disclosure includes a laminate. The laminate includes an active layer, a first semiconductor layer, and a second semiconductor layer. The first semiconductor layer and the second semiconductor layer sandwich the active layer in between. The light-emitting device further includes a current confining layer, a concave-shaped first reflecting mirror provided on side of the first semiconductor layer, and a second reflecting mirror provided on side of the second semiconductor layer. The current confining layer has an opening. The first reflecting mirror and the second reflecting mirror sandwich the laminate and the opening in between. The light-emitting device further includes a first reflecting layer and a phosphor layer. The first reflecting layer is disposed at a position opposed to the first reflecting mirror with a predetermined gap in between. The phosphor layer is disposed between the first reflecting mirror and the first (Continued)

reflecting layer, and performs wavelength conversion on light leaking from the first reflecting mirror.

15 Claims, 12 Drawing Sheets

(51) Int. Cl.
    *H01S 5/343*     (2006.01)
    *H01S 5/42*     (2006.01)

(52) U.S. Cl.
    CPC ...... *H01S 5/18308* (2013.01); *H01S 5/18361* (2013.01); *H01S 5/34333* (2013.01); *H01S 5/34346* (2013.01); *H01S 5/423* (2013.01)

(58) Field of Classification Search
    CPC ... H01S 5/34333; H01S 5/34346; H01S 5/423
    See application file for complete search history.

(56) References Cited

FOREIGN PATENT DOCUMENTS

| | | |
|---|---|---|
| JP | 05-075207 A | 3/1993 |
| JP | 05-75207 A | 3/1993 |
| JP | 10-200200 A | 7/1998 |
| JP | 2002-237653 A | 8/2002 |
| JP | 2004-134633 A | 4/2004 |
| JP | 2008-124287 A | 5/2008 |
| KR | 10-2002-0064521 A | 8/2002 |

[ FIG. 1 ]
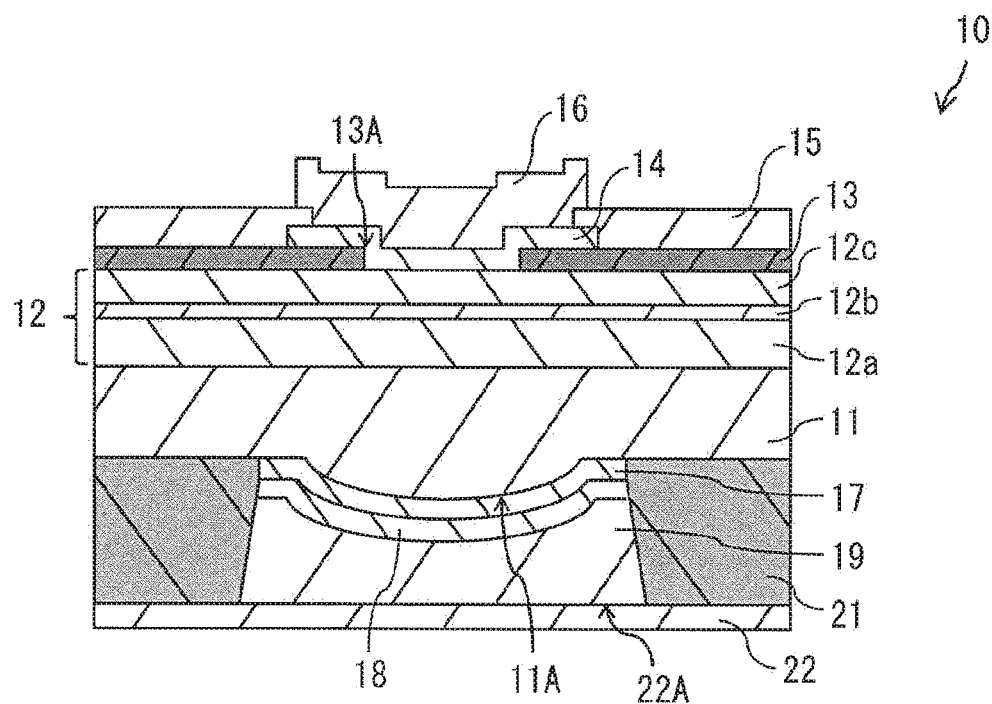
[ FIG. 2 ]
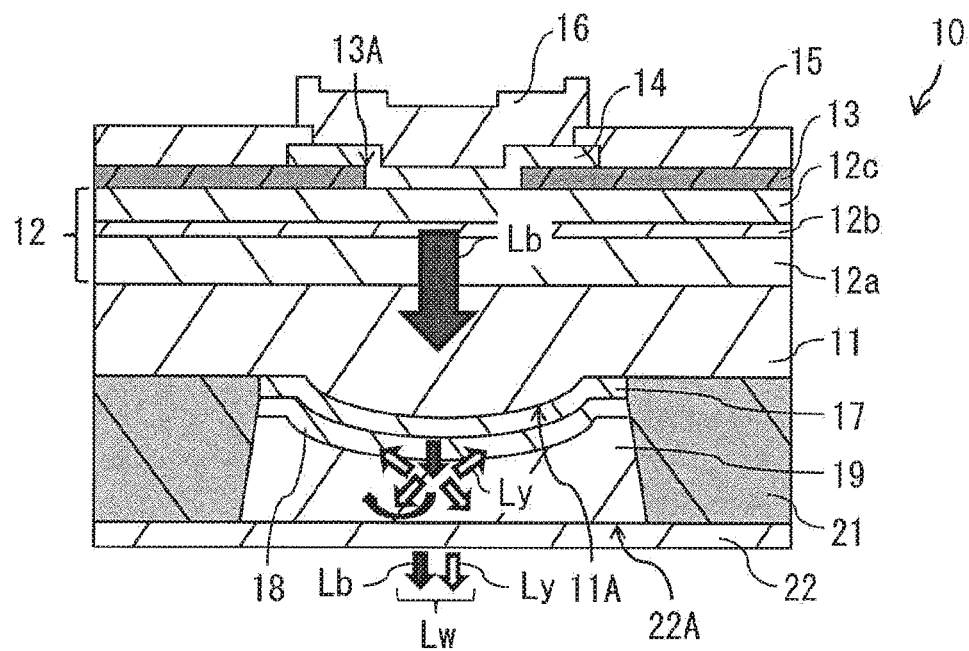

[ FIG. 3 ]
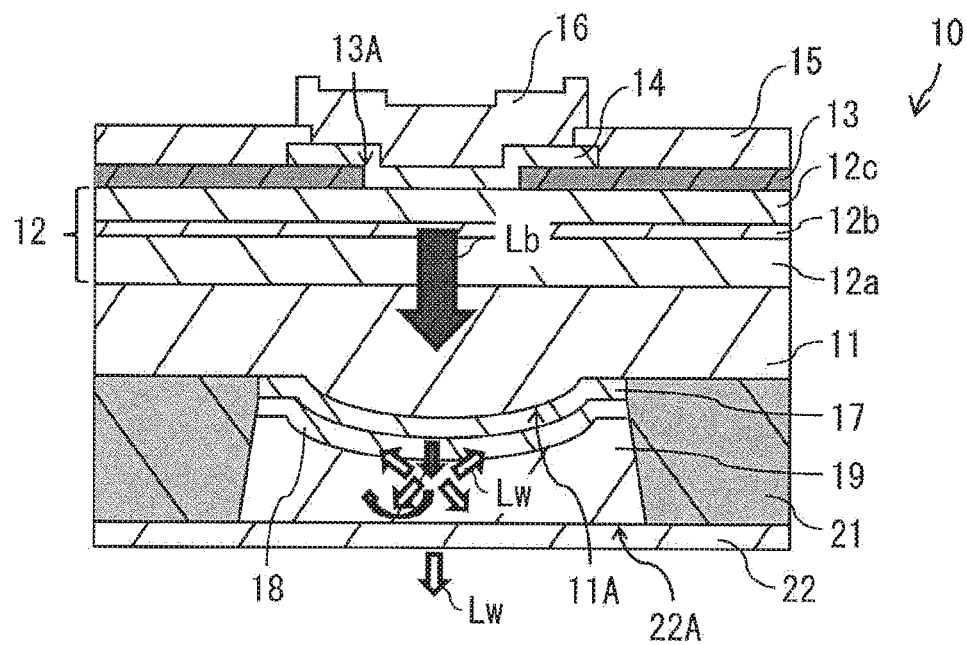
[ FIG. 4 ]
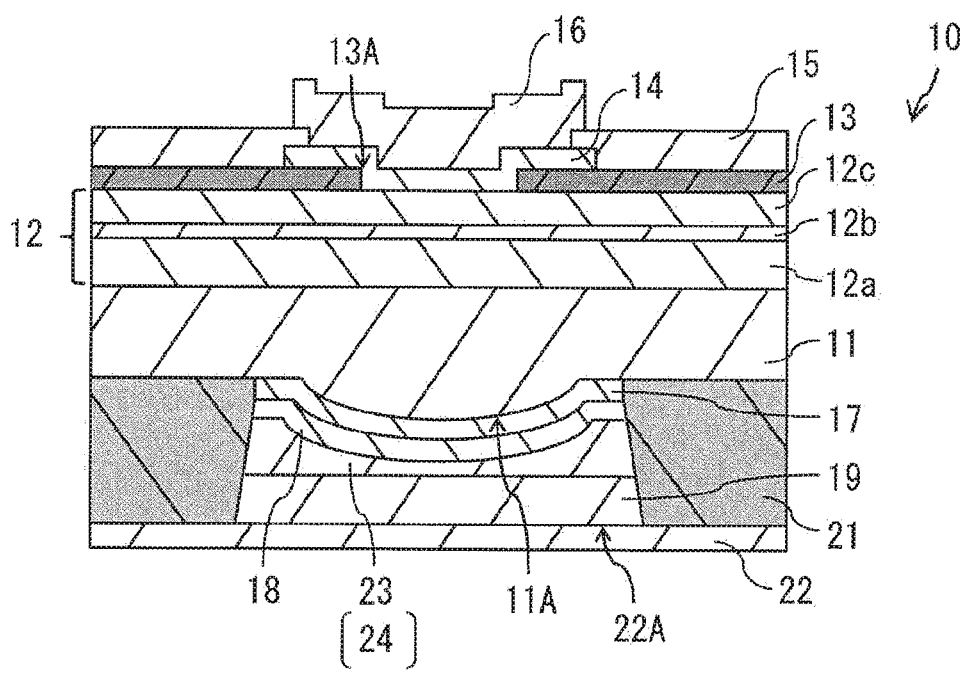

[ FIG. 5 ]
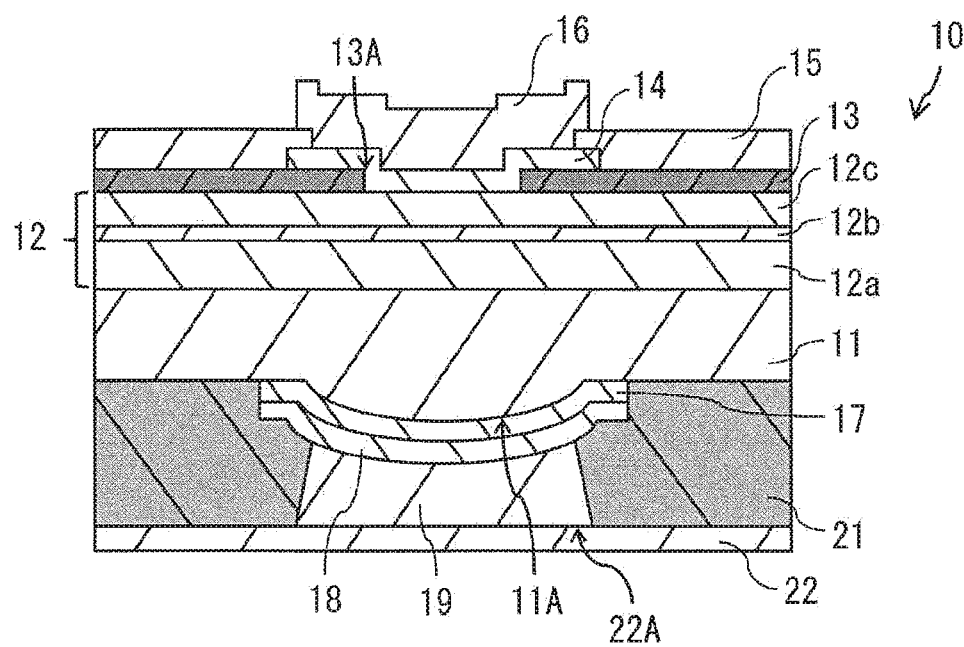
[ FIG. 6 ]
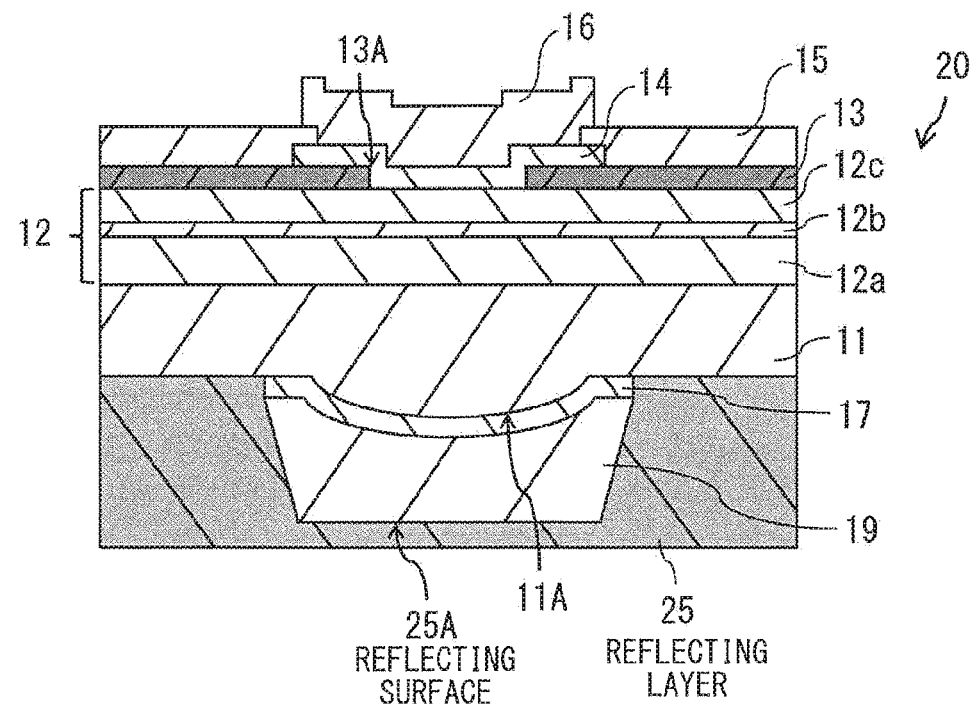

[ FIG. 7 ]
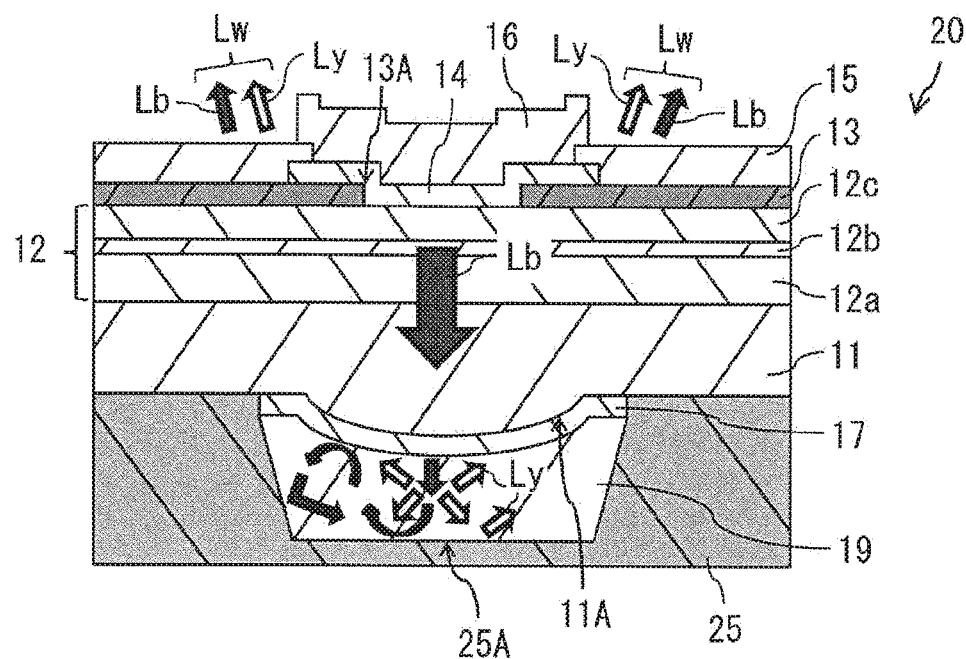
[ FIG. 8 ]
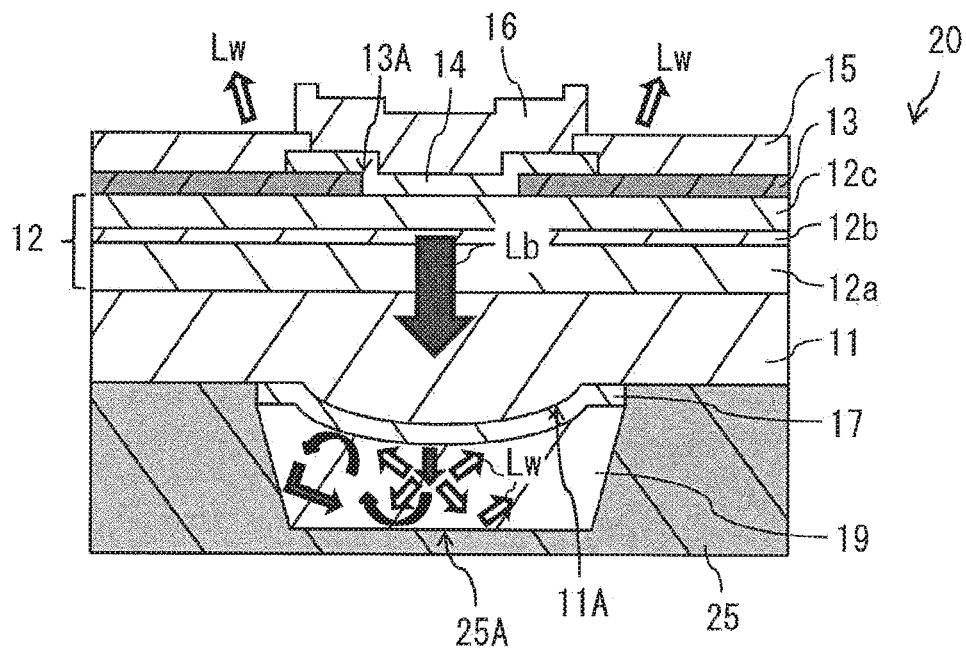

[FIG. 9]
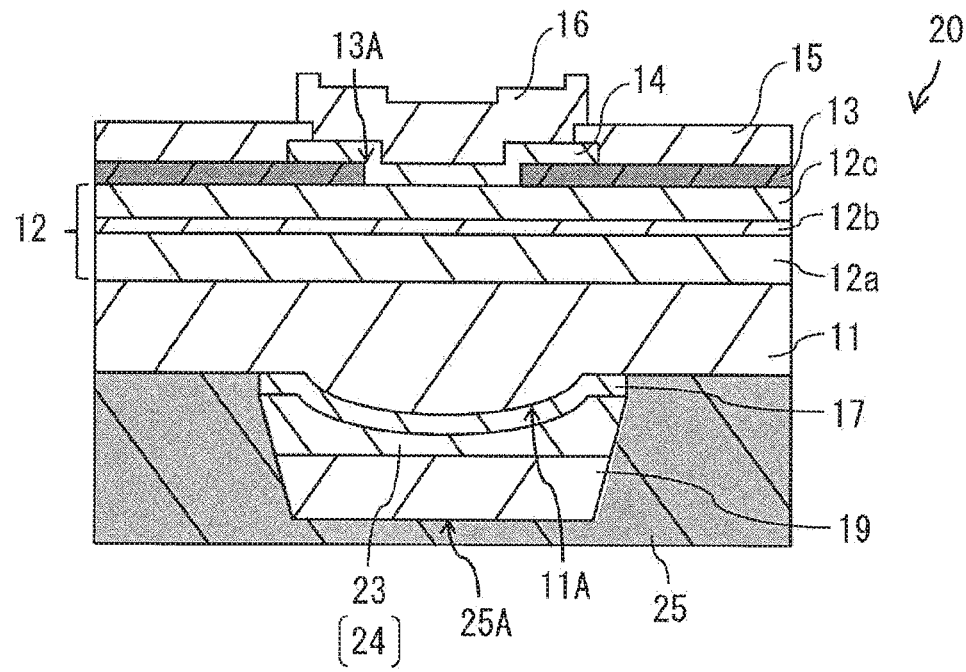
[FIG. 10]
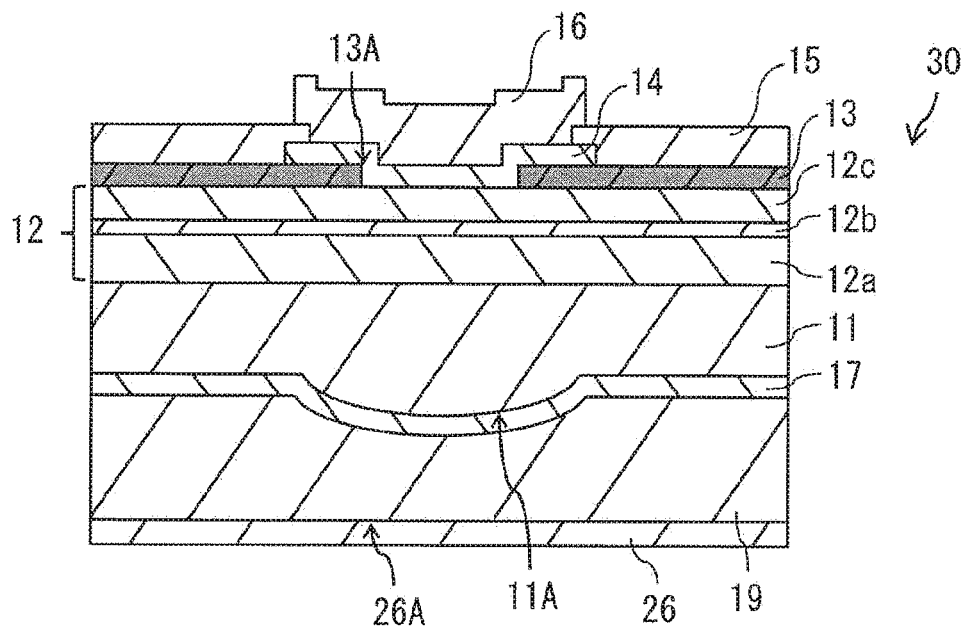

[ FIG. 11 ]
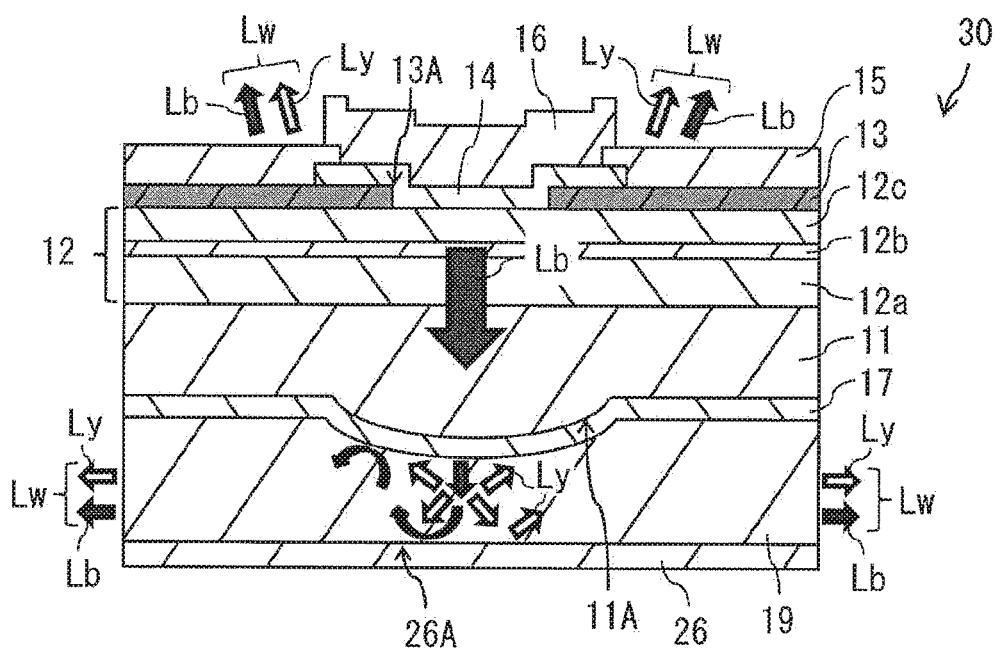
[ FIG. 12 ]
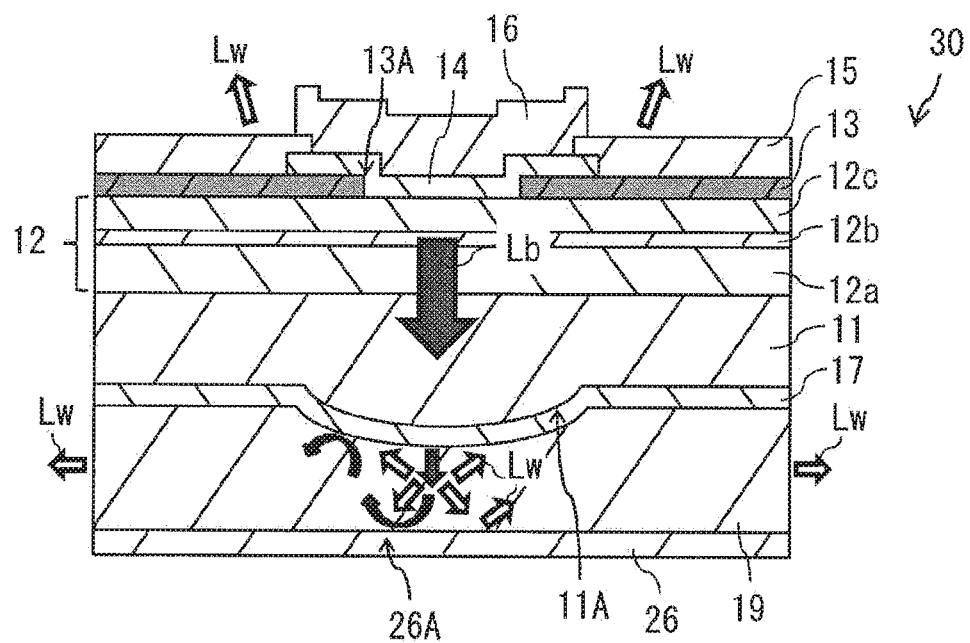

[ FIG. 13 ]
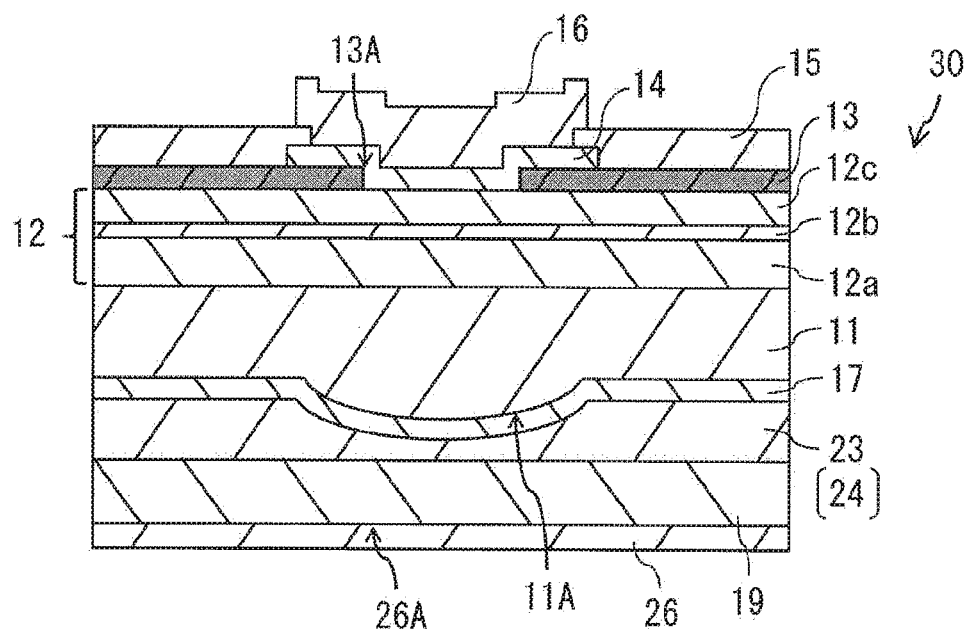
[ FIG. 14 ]
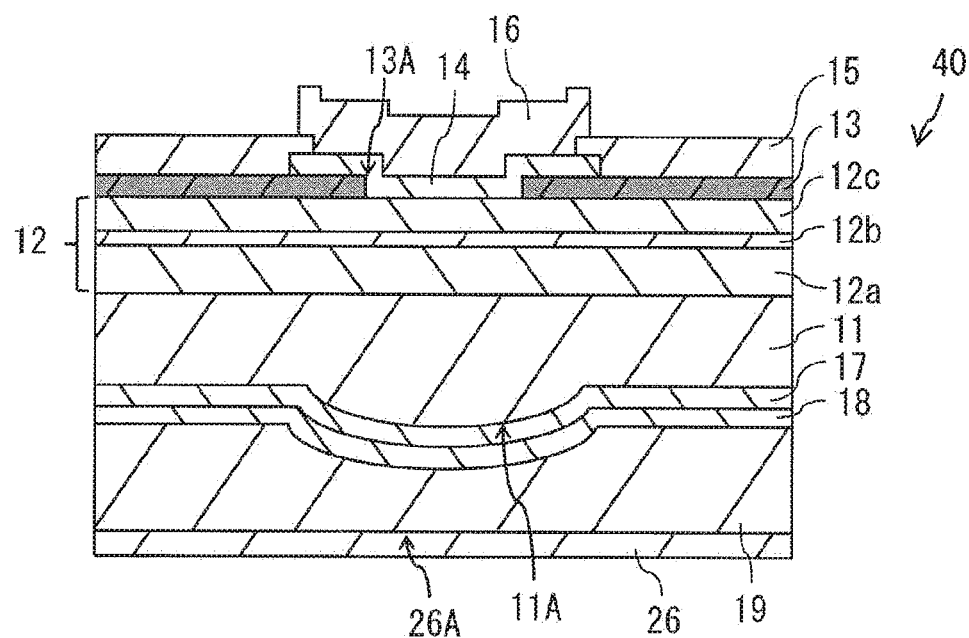

[ FIG. 15 ]
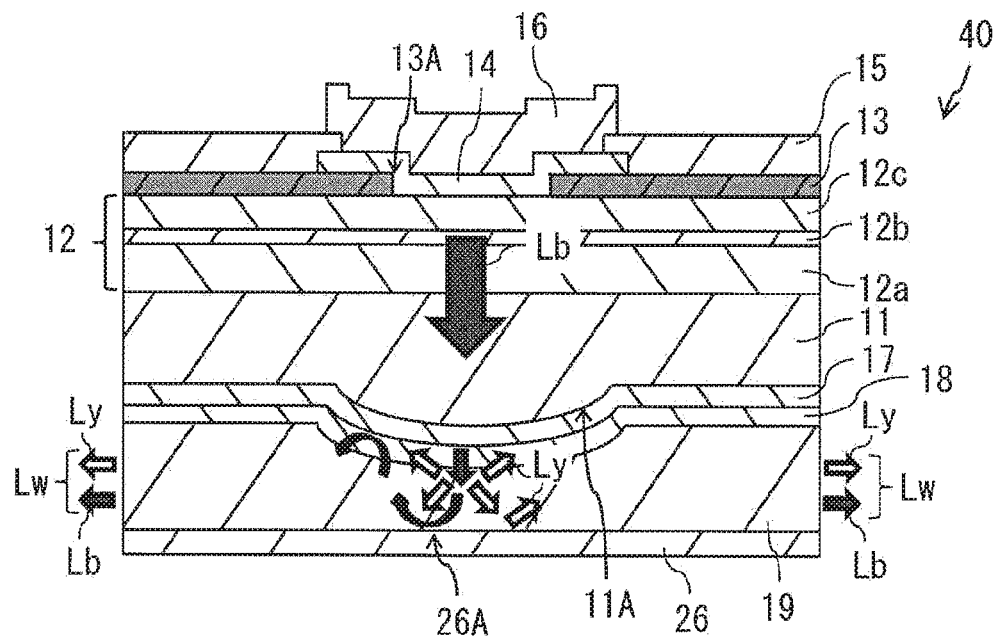
[ FIG. 16 ]
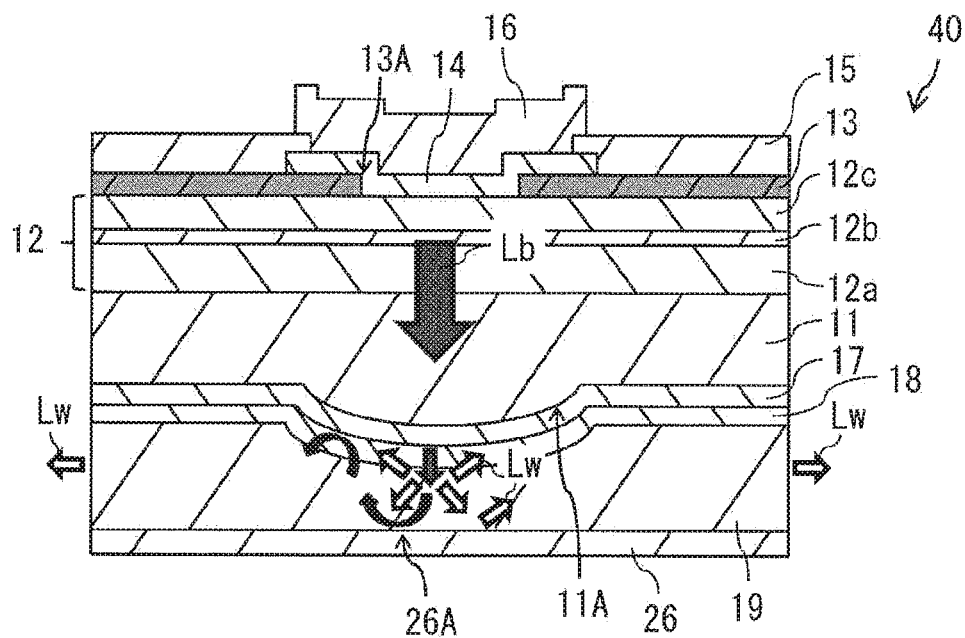

[ FIG. 17 ]
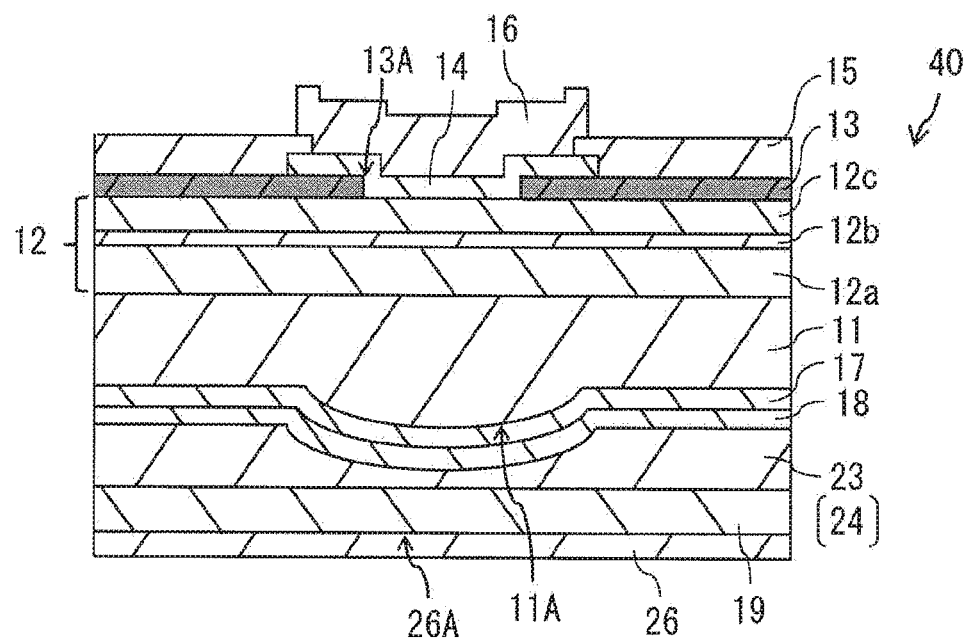
[ FIG. 18 ]
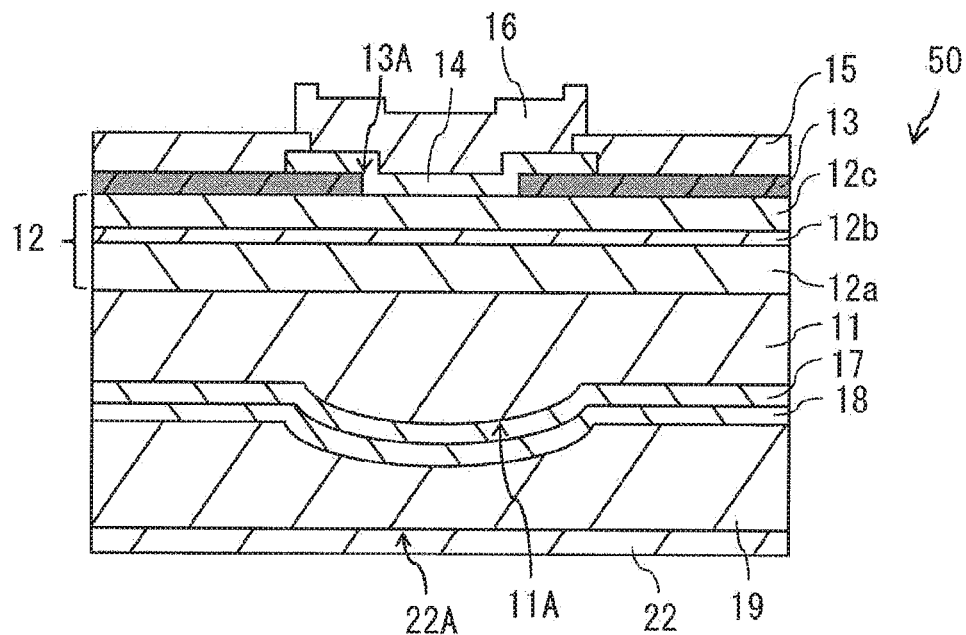

[ FIG. 19 ]
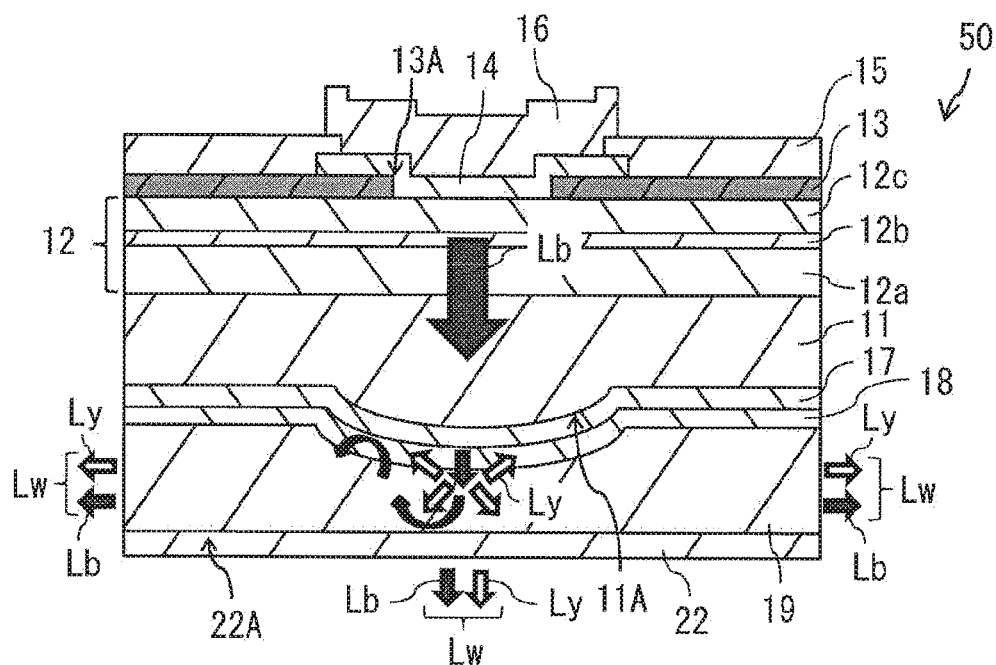
[ FIG. 20 ]
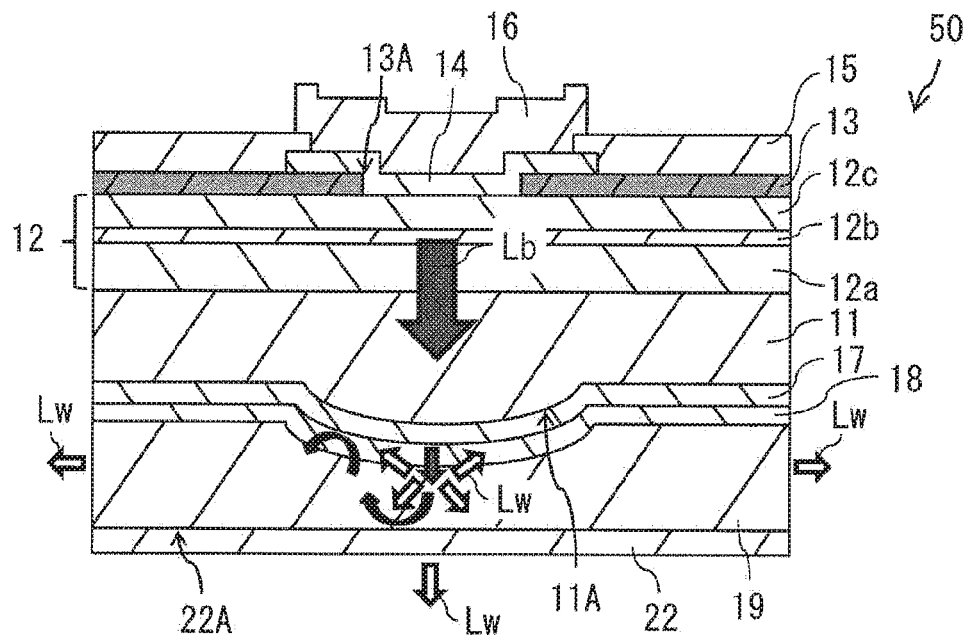

[ FIG. 21 ]
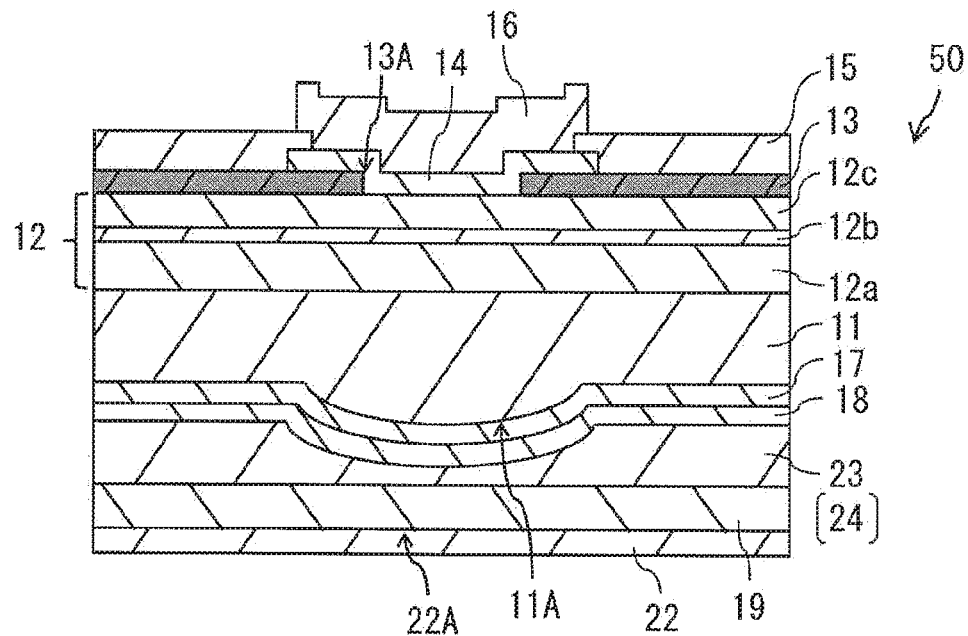
[ FIG. 22 ]
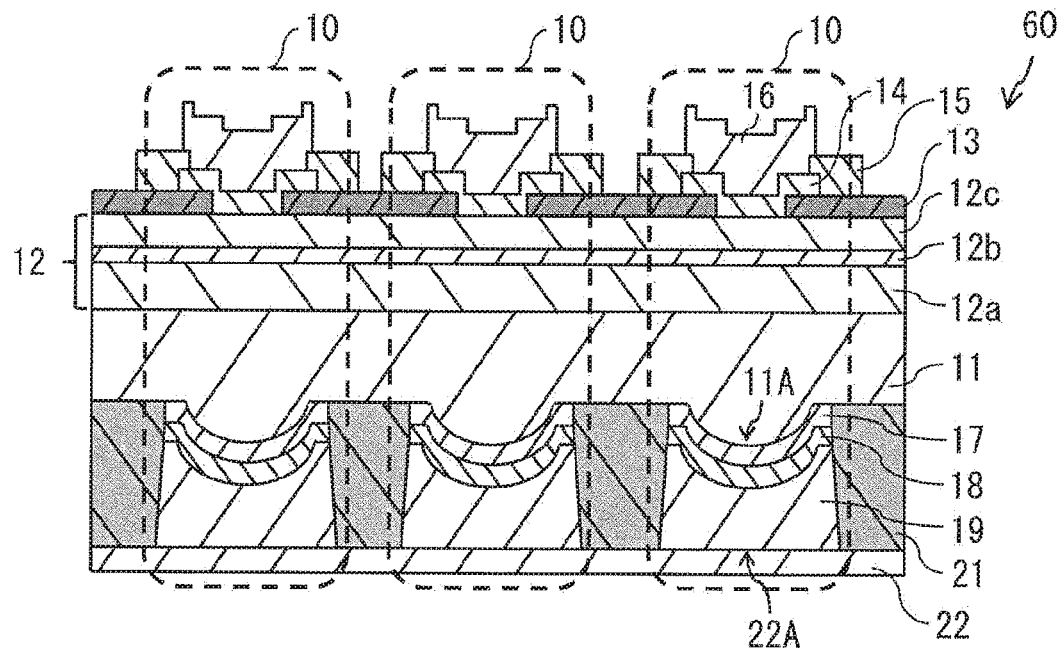

[ FIG. 23 ]
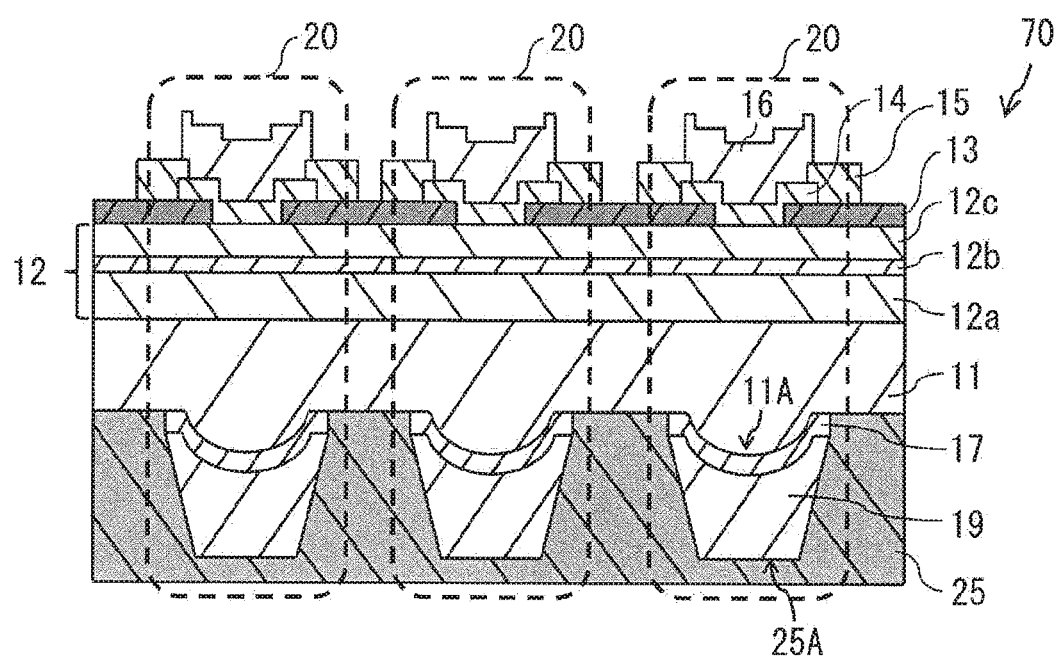

LIGHT-EMITTING DEVICE AND LIGHT-EMITTING APPARATUS

CROSS REFERENCE TO RELATED APPLICATIONS

This application is a U.S. National Phase of International Patent Application No. PCT/JP2018/008234 filed on Mar. 5, 2018, which claims priority benefit of Japanese Patent Application No. JP 2017-080354 filed in the Japan Patent Office on Apr. 14, 2017. Each of the above-referenced applications is hereby incorporated herein by reference in its entirety.

TECHNICAL FIELD

The present disclosure relates to a light-emitting device and a light-emitting apparatus.

BACKGROUND ART

A technology is disclosed that performs wavelength conversion on light emitted from a surface-emitting laser.

CITATION LIST

Patent Literature

PTL 1: Japanese Unexamined Patent Application Publication No. 2004-134633

SUMMARY OF THE INVENTION

In the meantime, in the patent literature mentioned above, it is necessary to provide a thick transparent substrate between a surface-emitting laser and a phosphor, which thus leads to a disadvantage that device miniaturization is not easy. Therefore, it is desirable to provide a light-emitting device and a light-emitting apparatus that allow for the miniaturization of the device.

A light-emitting device according to an embodiment of the present disclosure includes a laminate. The laminate includes an active layer, a first semiconductor layer, and a second semiconductor layer. The first semiconductor layer and the second semiconductor layer sandwich the active layer in between. The light-emitting device further includes a vertical resonator. The vertical resonator includes a current confining layer, a concave-shaped first reflecting mirror, and a second reflecting mirror. The current confining layer has an opening. The concave-shaped first reflecting mirror is provided on side of the first semiconductor layer. The second reflecting mirror is provided on side of the second semiconductor layer. The first reflecting mirror and the second reflecting mirror sandwich the laminate and the opening in between. The light-emitting device further includes a first reflecting layer and a phosphor layer. The first reflecting layer is disposed at a position opposed to the first reflecting mirror with a predetermined gap in between. The phosphor layer is disposed between the first reflecting mirror and the first reflecting layer. The phosphor layer performs wavelength conversion on light leaking from the vertical resonator.

A light-emitting apparatus according to an embodiment of the present disclosure includes a plurality of light-emitting devices. Each of the light-emitting devices has components identical to those of the aforementioned light-emitting device.

In the light-emitting device and the light-emitting apparatus according to the respective embodiments of the present disclosure, the reflecting mirror (first reflecting mirror) on the side of the first semiconductor layer is concave-shaped. Consequently, light leaking from the first reflecting mirror is spread by the concave-shaped first reflecting mirror. Further, in the light-emitting device and the light-emitting apparatus according to the respective embodiments of the present disclosure, the first reflecting layer is provided at the position opposed to the first reflecting mirror with the predetermined gap in between, and the phosphor layer is provided between the first reflecting mirror and the first reflecting layer. With this, the light leaking from the first reflecting mirror enters the phosphor layer at a wide radiation angle. Furthermore, the light leaking from the first reflecting mirror is obliquely reflected by the first reflecting layer. Therefore, the light reflected by the first reflecting layer enters a portion, of the phosphor layer, different from a portion through which the light leaking from the first reflecting mirror passes. As a result, as compared with a case where the light leaking from the first reflecting mirror enters the phosphor layer at a narrow wide radiation angle, uniformity of intensity distribution of light radiated from the phosphor layer improves. That is, the uniformity of the intensity distribution of the light radiated from the phosphor layer improves even without placing the phosphor layer far away from the first reflecting mirror.

According to the light-emitting device and the light-emitting apparatus of the respective embodiments of the present disclosure, the uniformity of the intensity distribution of the light radiated from the phosphor layer improves without placing the phosphor layer far away from the first reflecting mirror, which thereby allows for the device miniaturization. It is to be noted that effects of the present disclosure are not necessarily limited to the effects described here and may be any of the effects described herein.

BRIEF DESCRIPTION OF DRAWINGS

FIG. 1 is a diagram illustrating an example of a cross-sectional configuration of a light-emitting device according to a first embodiment of the present disclosure.

FIG. 2 is a diagram schematically illustrating how light is emitted in a light-emitting device in FIG. 1.

FIG. 3 is a diagram schematically illustrating how the light is emitted in the light-emitting device in FIG. 1.

FIG. 4 is a diagram illustrating a modification example of the cross-sectional configuration of the light-emitting device in FIG. 1.

FIG. 5 is a diagram illustrating a modification example of the cross-sectional configuration of the light-emitting device in FIG. 1.

FIG. 6 is a diagram illustrating an example of a cross-sectional configuration of a light-emitting device according to a second embodiment of the present disclosure.

FIG. 7 is a diagram schematically illustrating how light is emitted in a light-emitting device in FIG. 6.

FIG. 8 is a diagram schematically illustrating how the light is emitted in the light-emitting device in FIG. 6.

FIG. 9 is a diagram illustrating a modification example of the cross-sectional configuration of the light-emitting device in FIG. 6.

FIG. 10 is a diagram illustrating an example of a cross-sectional configuration of a light-emitting device according to a third embodiment of the present disclosure.

FIG. 11 is a diagram schematically illustrating how light is emitted in a light-emitting device in FIG. 10.

FIG. 12 is a diagram schematically illustrating how the light is emitted in the light-emitting device in FIG. 10.

FIG. 13 is a diagram illustrating a modification example of the cross-sectional configuration of the light-emitting device in FIG. 10.

FIG. 14 is a diagram illustrating an example of a cross-sectional configuration of a light-emitting device according to a fourth embodiment of the present disclosure.

FIG. 15 is a diagram schematically illustrating how light is emitted in a light-emitting device in FIG. 14.

FIG. 16 is a diagram schematically illustrating how the light is emitted in the light-emitting device in FIG. 14.

FIG. 17 is a diagram illustrating a modification example of the cross-sectional configuration of the light-emitting device in FIG. 14.

FIG. 18 is a diagram illustrating an example of a cross-sectional configuration of a light-emitting device according to a fifth embodiment of the present disclosure.

FIG. 19 is a diagram schematically illustrating how light is emitted in a light-emitting device in FIG. 18.

FIG. 20 is a diagram schematically illustrating how the light is emitted in the light-emitting device in FIG. 18.

FIG. 21 is a diagram illustrating a modification example of the cross-sectional configuration of the light-emitting device in FIG. 18.

FIG. 22 is a diagram illustrating an example of a cross-sectional configuration of a light-emitting apparatus according to a sixth embodiment of the present disclosure.

FIG. 23 is a diagram illustrating an example of a cross-sectional configuration of a light-emitting apparatus according to a seventh embodiment of the present disclosure.

MODES FOR CARRYING OUT THE INVENTION

In the following, some embodiments of the present disclosure are described in detail with reference to the drawings. The description below illustrates specific examples of the present disclosure, and the present disclosure is not limited to the following embodiments. Moreover, the present disclosure is not limited to arrangements, dimensions, dimension ratios, etc. of respective components illustrated in the drawings. It is to be noted that description is given in the following order.
1. First Embodiment (Light-emitting Device)
2. Modification Example of First Embodiment (Light-emitting Device)
3. Second Embodiment (Light-emitting Device)
4. Modification Example of Second Embodiment (Light-emitting Device)
5. Third Embodiment (Light-emitting Device)
6. Modification Example of Third Embodiment (Light-emitting Device)
7. Fourth Embodiment (Light-emitting Device)
8. Modification Example of Fourth Embodiment (Light-emitting Device)
9. Fifth Embodiment (Light-emitting Device)
10. Modification Example of Fifth Embodiment (Light-emitting Device)
11. Sixth Embodiment (Light-emitting Apparatus)
12. Seventh Embodiment (Light-emitting Apparatus)

1. First Embodiment

[Configuration]
Description is given of a configuration of a light-emitting device 10 according to a first embodiment of the present disclosure. FIG. 1 illustrates an example of a cross-sectional configuration of the light-emitting device 10.

The light-emitting device 10 is a semiconductor laser of an upper surface emission type being suitably applicable to an application in which it is necessary to be thin and have low consumption power, an application in which it is necessary to be thin and have a large area, etc. The light-emitting device 10 includes a vertical resonator. The vertical resonator is configured to oscillate at a predetermined oscillation wavelength $\lambda_\theta$ by two DBRs (distributed Bragg reflectors). The two DBRs are opposed to each other in a direction of a normal to a substrate 11 to be described later. The vertical resonator includes two DBR layers sandwiching the substrate 11, a laminate 12 to be described later, and an opening 13A of a current confining layer 13 to be described later in between. That is, the substrate 11 is a substrate provided inside the vertical resonator. The aforementioned two DBR layers include a DBR layer 17 (first reflecting mirror) on side of a semiconductor layer 12a to be described later and a DBR layer 16 (second reflecting layer) on side of a semiconductor layer 12c to be described later. The DBR layer 17 is provided in contact with a rear surface of the substrate 11. The laminate 12 is configured to include, for example, an active layer 12b and two semiconductor layers sandwiching the active layer 12b in between. The aforementioned two semiconductor layers include the semiconductor layer 12a closer to the substrate 11 and the semiconductor layer 12c farther from the substrate 11.

For example, the light-emitting device 10 includes, on the substrate 11, the semiconductor layer 12a, the active layer 12b, the semiconductor layer 12c, the current confining layer 13, an electrode layer 14, an electrode pad 15, and the DBR layer 16 from side of the substrate 11 in this order. The light-emitting device 10 further includes, for example, the DBR layer 17, a reflecting layer 18, a phosphor layer 19, a reflector 21, and a reflecting layer 22 on the rear surface side of the substrate 11. The laminate 12 may have, for example, a contact layer on an outermost surface on the side of the semiconductor layer 12c. The contact layer brings the semiconductor layer 12c and the electrode layer 14 in ohmic contact with each other. The contact layer may be a layer formed by doping an outermost surface of the semiconductor layer 12c with impurities of high concentration or a layer formed separately from the semiconductor layer 12c and being in contact with the outermost surface of the semiconductor layer 12c.

The DBR layer 16 corresponds to a specific example of the "second reflecting mirror" of the present disclosure. The DBR layer 17 corresponds to a specific example of the "first reflecting mirror" of the present disclosure. The reflecting layer 18 corresponds to a specific example of the "second reflecting layer" of the present disclosure. The reflector 21 corresponds to a specific example of the "third reflecting layer" of the present disclosure. The reflecting layer 22 corresponds to a specific example of the "first reflecting layer" of the present disclosure.

The substrate 11 is a crystal growth substrate used in epitaxial crystal growth of the laminate 12. The substrate 11 and the laminate 12 include gallium-nitride-based semiconductors. The substrate 11 is a GaN substrate, for example. The laminate 12 includes, for example, GaN, AlGaN, AlInN, GaInN, AlGaInN, etc. The semiconductor layer 12a includes GaN, for example. The semiconductor layer 12a includes, for example, silicon (Si), etc., as an n-type impurity. That is, the semiconductor layer 12a is an n-type semiconductor layer. The semiconductor layer 12c includes GaN, for example. The semiconductor layer 12c includes, for example, magnesium (Mg), zinc (Zn), etc., as a p-type impurity. That is, the semiconductor layer 12c is a p-type semiconductor layer. The active layer 12b has a quantum well structure, for example. Examples of a type of the quantum well structure include a single quantum well structure (QW structure) and a multiple quantum well structure (MQW structure). The quantum well structure has a structure in which well layers and barrier layers are alternately stacked. Examples of a combination of the well layers and the barrier layers include $(In_yGa_{(1-y)}N, GaN)$, $(In_yGa_{(1-y)}N, In_zGa_{(1-z)}N)$ [where y>z], $(In_yGa_{(1-y)}N, AlGaN)$, etc.

The current confining layer 13 is a layer that is directed to confining of a current to be injected into the active layer 12b. The current confining layer 13 includes an insulation layer having the opening 13A, for example. The insulation layer is provided in contact with an outermost surface of the laminate 12, for example, and includes an inorganic material such as $SiO_2$, for example. It is to be noted that the insulation layer may include a high resistance region. The high resistance region is formed by injection of impurities into the laminate 12 from the side of the semiconductor layer 12c of the laminate 12. The light-emitting device 10 may include a component having a function equivalent to that of the current confining layer 13, in place of the current confining layer 13. The light-emitting device 10 may include a contact layer between the semiconductor layer 12c and the electrode layer 14. The contact layer has a size equivalent to that of the opening 13A. Such a contact layer is formed by forming a contact layer on an entire surface of the semiconductor layer 12c, and thereafter selectively etching the contact layer with a RIE (Reactive Ion Etching) method. Provision of such a contact layer also makes it possible to perform electric confinement. Further, the light-emitting device 10 may have an annular oxidization region. The annular oxidization region is formed by partial oxidation of some layers of the laminate 12 from a lateral direction. Provision of such an oxidization region also makes it possible to perform the current confinement. The opening 13A is circular, for example. The opening 13A has a diameter of approximately 10 μm, for example.

The electrode layer 14 is in contact with a surface, of the laminate 12, exposed to a bottom surface of the opening 13A of the current confining layer 13. The electrode layer 14 includes, for example, a transparent conductive material. Examples of the transparent conductive material to be used in the electrode layer 14 include ITO (Indium Tin Oxide), etc. The electrode pad 15 is to be electrically coupled to an external electrode or circuit, and electrically coupled to the electrode layer 14. The electrode pad 15 is in contact with a portion, of the electrode layer 14, not opposed to the opening 13A, for example. The electrode pad 15 includes, for example, Pd/Ti/Pt/Au or Ti/Pd/Au, Ti/Ni/Au, etc. The light-emitting device 10 includes, in addition to the electrode layer 14, an electrode electrically coupled to the semiconductor layer 12a as an electrode directed to injecting of a current into the active layer 12b. It is to be noted that an example of this electrode is not illustrated in the drawing.

The DBR layers 16 and 17 each include a dielectric multi-layer, for example. The dielectric multi-layer has a structure in which layers each having a low refractive index and layers each having a high refractive index are alternately stacked. It is preferable that the layer having the low refractive index have a thickness of an odd multiple of $\lambda_\theta/4_{n1}$ ($n_1$ is a refractive index of the layer having the low refractive index). It is preferable that the layer having the high refractive index have a thickness of an odd multiple of $\lambda_\theta/4_{n2}$ ($n_2$ is the refractive index of the layer having the high refractive index). Examples of materials included in the DBR layers 16 and 17 include $SiO_2$, SiN, $Al_2O_3$, $Nb_2O_5$, $Ta_2O_5$, $TiO_2$, AlN, MgO, and $ZrO_2$. Examples of a combination of the layer having the low refractive index and the layer having the high refractive index include $SiO_2/SiN$, $SiO_2/Nb_2O_5$, $SiO_2/ZrO_2$, $SiO_2/AlN$, $SiO_2/Ta_2O_5$, etc. The dielectric multi-layer included in the DBR layers 16 and 17 is formed by a film deposition method such as sputtering, CVD, or vapor deposition, for example.

The substrate 11 has a projection portion 11A projecting on side opposite to the laminate 12. A surface of the projection portion 11A is shaped like a convex projecting to the side opposite to the laminate 12. Preferably, the surface of the projection portion 11A has a radius of curvature that is greater than a resonator length of the vertical resonator. One reason for this is that, in a case where the surface of the projection portion 11A has the radius of curvature smaller than the resonator length in the vertical resonator, confinement of an optical field becomes excessive and light loss occurs more easily. The DBR layer 17 is provided following the surface of the projection portion 11A and serves as a concave-shaped (or concave-curve-shaped) reflecting mirror for the vertical resonator. The projection portion 11A has a diameter of approximately 40 μm. Meanwhile, the DBR layer 16 is provided following a surface of the electrode layer 14 and provided in contact with the surface of the electrode layer 14. Regarding the DBR layer 16, a portion, of the DBR layer 16, opposed to the opening 13A is substantially flat. It is preferable that the active layer 12b be disposed more proximate to the DBR layer 16 and the current confining layer 13 than to the DBR layer 17. One reason for this is that the confinement of the optical field in the active layer 12b becomes stronger, facilitating laser oscillation. Further, it is preferable that a minimum distance DCI from an area centroid point of the current confining layer 13 to an inner edge of the opening 13A satisfy the following expression. One reason for this is that this causes a region where light reflected by the DBR layer 17 is collected to be included in a region where the active layer 12b has a gain as a result of injection of a current, and promotes induced emission of light from a carrier, facilitating the laser oscillation. It is to be noted that derivation of the following expression is disclosed in H. Kogelnik and T. Li, "Laser Beams and Resonators", Applied Optics/Vol. 5, No. 10/October 1966, for example. Further, $\omega_\theta$ is also referred to as a beam waist radius.

$$D_{CI} \geq \omega_\theta/2$$

where $$\omega_\theta^2 \equiv (\lambda_\theta/\pi)\{L_{OR}(R_{DBR}-L_{OR})\}^{1/2}$$

where
$\lambda_\theta$: Oscillation wavelength
$L_{OR}$: Resonator length
$R_{DDR}$: Radius of curvature of the DBR layer 17 (=radius of curvature of the surface of the projection portion 11A)

The reflecting layer 18 is provided following a surface of the DBR layer 17 and provided in contact with the surface of the DBR layer 17. The reflecting layer 18 is disposed between the DBR layer 17 and the phosphor layer 19. The reflecting layer 18 reflects light (yellow light Ly to be described later) generated by wavelength conversion performed by the phosphor layer 19. The reflecting layer 18 includes a dielectric multi-layer, for example.

The phosphor layer 19 is disposed between the DBR layer 17 and the reflecting layer 22. The phosphor layer 19 is in contact with the reflecting layer 18. The phosphor layer 19 performs wavelength conversion on light leaking from the DBR layer 17 (that is, the vertical resonator). For example, as illustrated in FIG. 2, of blue light Lb generated by the active layer 12b, the phosphor layer 19 absorbs some of the light (blue light Lb) leaking from the DBR layer 17 (that is, the vertical resonator) to generate the yellow light Ly. It is to be noted that, of the blue light Lb generated by the active layer 12b, the phosphor layer 19 may absorb some of the light (blue light Lb) leaking from the DBR layer 17 (that is, the vertical resonator) to generate white light Lw, for example, as illustrated in FIG. 3.

The reflector 21 covers side surfaces of the phosphor layer 19 and is provided not to cover a portion, of a reflecting surface 22A, that is opposed to the opening 13A. The reflector 21 is a heat dissipator that includes a material including metal such as aluminum and dissipates heat generated in the phosphor layer 19 to the outside via the reflector 21. The reflector 21 is provided in contact with the rear surface of the substrate 11, for example, and covers the side surfaces of the phosphor layer 19 as well as side surfaces of the DBR layer 17 and side surfaces of the reflecting layer 18, for example.

The reflecting layer 22 is disposed at a position opposed to the DBR layer 17 with a predetermined gap in between. The reflecting layer 22 has the reflecting surface 22A not following a surface shape of the DBR layer 17. The reflecting surface 22A is a planar surface having a normal parallel to a normal to the laminate 12, for example. The reflecting layer 22 is configured to include a Bragg reflecting mirror in which, for example, a reflectance with respect to light (blue light Lb) leaking from the DBR layer 17 is greater than a reflectance with respect to the light (yellow light Ly to be described later) generated by the wavelength conversion performed by the phosphor layer 19. With this, as illustrated in FIG. 2, for example, the reflecting layer 22 transmits some of the light (yellow light Ly) generated by the wavelength conversion performed by the phosphor layer 19. Furthermore, as illustrated in FIG. 2, for example, the reflecting layer 22 transmits some of the blue light Lb that reenters the reflecting layer 22, for example, by being scattered in the phosphor layer 19, while reflecting much of the light (blue light Lb) leaking from the DBR layer 17. As a result, the reflecting layer 22 emits the white light Lw to the outside. The white light Lw is synthesized light of the blue light Lb and the yellow light Ly.

It is to be noted that, as illustrated in FIG. 3, for example, the reflecting layer 22 may transmit some of the light (white light Lw) generated by the wavelength conversion performed by the phosphor layer 19 and reflect much of the light (blue light Lb) leaking from the DBR layer 17. In this case, the reflecting layer 22 is configured to include the Bragg reflecting mirror in which the reflectance to the light (blue light Lb) leaking from the DBR layer 17 is larger than the reflectance with respect to the light (white light Lw) generated by the wavelength conversion performed by the phosphor layer 19. At this time, the reflecting layer 22 outputs the light (white light Lw) generated by the wavelength conversion performed by the phosphor layer 19 to the outside.

[Operation]

In the light-emitting device 10 having such a configuration, application of a predetermined voltage between the electrode layer 14 electrically coupled to the semiconductor layer 12c and an electrode layer electrically coupled to the semiconductor layer 12a injects a current into the active layer 12b through the opening 13A. This results in emission of light by recombination of an electron with a hole. The light is reflected by a pair of the DBR layer 16 and the DBR layer 17, resulting in the laser oscillation at the predetermined oscillation wavelength $\lambda\theta$. Then, some of the light (blue light Lb) leaking from the DBR layer 17 is subjected to wavelength conversion performed by the phosphor layer 19.

In a case where the light subjected to the wavelength conversion performed by the phosphor layer 19 is the yellow light Ly, as illustrated in FIG. 2, for example, some of the blue light Lb that reenters the reflecting layer 22, for example, by being scattered in the phosphor layer 19 passes through the reflecting layer 22, while much of the light (blue light Lb) leaking from the DBR layer 17 is reflected by the reflecting layer 22. As a result, the white light Lw is emitted from the reflecting layer 22 to the outside. The white light Lw is the synthesized light of the blue light Lb and the yellow light Ly.

In a case where the light subjected to the wavelength conversion performed by the phosphor layer 19 is the white light Lw, as illustrated in FIG. 3, for example, some of the light (white light Lw) generated by the wavelength conversion performed by the phosphor layer 19 passes through the reflecting layer 22. As a result, the light (white light Lw) generated by the wavelength conversion performed by the phosphor layer 19 is outputted from the reflecting layer 22 to the outside.

[Effects]

In the following, description is given of effects of the light-emitting device 10 according to the present embodiment.

A technique has been disclosed that performs wavelength conversion of light emitted from a surface-emitting laser. The wavelength conversion has been performed by: widening a laser beam through irradiation of a phosphor with laser light via a thick transparent substrate; causing an optical film and one mirror of a vertical resonator to reciprocate the laser light via the transparent substrate; and uniformly irradiating the phosphor with the laser light. The optical film and the mirror of the vertical resonator are so provided as to sandwich the transparent substrate in between. In such a method, however, it is necessary to provide a thick transparent substrate between the surface-emitting laser and the phosphor, thus making the device miniaturization difficult.

In contrast, in the present embodiment, the DBR layer 17 is concave-shaped (or concave-curve-shaped). Consequently, the light leaking from the DBR layer 17 (vertical resonator) is spread by the concave-shaped (or concave-curve-shaped) DBR layer 17. Further, in the present embodiment, the reflecting layer 22 is provided at the position opposed to the DBR layer 17 with the predetermined gap in between, and the phosphor layer 19 is provided between the DBR layer 17 and the reflecting layer 22. With this, the light leaking from the DBR layer 17 (vertical resonator) enters the phosphor layer 19 at a wide radiation angle. Furthermore, since the light leaking from the DBR layer 17 (vertical resonator) is obliquely reflected at the reflecting layer 22, the light reflected by the reflecting layer 22 enters a portion, of the phosphor layer 19, different from a portion through which the light leaking from the DBR layer 17 (vertical resonator) passes. As a result, as compared with a case where the light leaking from the DBR layer 17 (vertical resonator) enters the phosphor layer 19 at a narrow wide radiation angle, uniformity of intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible. In addition, it is possible to achieve a white light-emitting device that is small in size but has a bright and stable color.

Further, in the present embodiment, the reflecting layer 22 has the reflecting surface 22A not following the surface shape of the DBR layer 17. Specifically, the reflecting surface 22A is a planar surface having the normal parallel to the normal to the laminate 12. With this, much of the light leaking from the DBR layer 17 (vertical resonator) is obliquely reflected by the reflecting layer 22, and therefore, much of the light reflected by the reflecting layer 22 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at a narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible.

Moreover, in the present embodiment, in a case where the reflecting layer 22 includes the Bragg reflecting mirror in which the reflectance with respect to the light leaking from the DBR layer 17 is greater than the reflectance with respect to the light generated by the wavelength conversion performed by the phosphor layer 19, it is possible to output, to the outside, only light that has passed through the Bragg reflecting mirror. As a result, it is possible to output, to the outside, the white light Lw that is the synthesized light of the blue light Lb and the yellow light Ly, or the white light Lw generated by the phosphor layer 19, for example.

Moreover, in the present embodiment, the reflecting layer 18 is provided between the DBR layer 17 and the phosphor layer 19. This makes it possible to prevent the light generated by the wavelength conversion performed by the phosphor layer 19 from being scattered and lost to the side of the laminate 12. As a result, it is possible to effectively utilize the light generated by the wavelength conversion performed by the phosphor layer 19 as optical output to the outside.

Moreover, in the present embodiment, the reflector 21 is so provided as to cover the side surfaces of the phosphor layer 19 and not to cover a portion, of the reflecting surface 22A, that is opposed to the opening 13A. This makes it possible to reflect, to the side of the reflecting layer 22, the light generated by the wavelength conversion performed by the phosphor layer 19, the light reflected by the reflecting layer 22, etc. As a result, it is possible to effectively utilize the light generated by the wavelength conversion performed by the phosphor layer 19, or the light reflected by the reflecting layer 22, etc. as the optical output to the outside.

Moreover, in the present embodiment, in a case where the reflector 21 is the heat dissipator that includes the material including the metal, it is possible to diffuse the heat generated in the phosphor layer 19 to the outside via the reflector 21. As a result, it is possible to suppress a decrease in conversion efficiency of the phosphor layer 19 by heat storage.

Moreover, in the present embodiment, the phosphor layer 19 is in contact with the reflecting layer 18. This makes it possible to achieve a white light-emitting device that is small in size and has a bright and stable color.

2. Modification Examples of First Embodiment

In the following, description is given of modification examples of the light-emitting device 10 of the first embodiment.

Modification Example A

FIG. 4 illustrates a modification example of the cross-sectional configuration of the light-emitting device 10. In the present modification example, the light-emitting device 10 includes a resin layer 23 or an air layer 24 between the reflecting layer 18 and the phosphor layer 19. That is, the phosphor layer 19 is opposed to the reflecting layer 18 with the resin layer 23 or the air layer 24 in between. The resin layer 23 includes polyimide, for example. Even in such a case, the device miniaturization is possible. Moreover, it is possible to achieve a white light-emitting device that is small in size but has a bright and stable color.

Modification Example B

FIG. 5 illustrates a modification example of the cross-sectional configuration of the light-emitting device 10. In the present modification example, the reflector 21 is provided in contact with a surface of an end of the reflecting layer 18, in addition to the rear surface of the substrate 11. In such a case, it is possible to make size of the device in a width direction smaller. Further, since the size of the phosphor layer 19 in the width direction is made smaller, it is possible to further more promptly diffuse the heat generated in the phosphor layer 19 via the reflector 21.

3. Second Embodiment

In the following, description is given of a light-emitting device 20 according to a second embodiment of the present disclosure.
[Configuration]
FIG. 6 illustrates an example of a cross-sectional configuration of the light-emitting device 20. The light-emitting device 20 corresponds to a light-emitting device in which the reflecting layer 18, the reflector 21, and the reflecting layer 22 in the light-emitting device 10 of the aforementioned embodiment are omitted and that includes a reflecting layer 25 instead. Therefore, in the present embodiment, the phosphor layer 19 is in contact with the DBR layer 17. The reflecting layer 25 corresponds to a specific example of the "first reflecting layer" or the "fourth reflecting layer" in the present disclosure.

The reflecting layer 25 is so provided as to cover the side surfaces of the phosphor layer 19 and is so provided as to reflect, to the side of the laminate 12, the light leaking from the DBR layer 17 and the light generated by the wavelength conversion performed by the phosphor layer 19. The reflecting layer 25 covers a bottom surface of the phosphor layer 19 as well as the side surfaces of the phosphor layer 19. A portion, of the reflecting layer 25, opposed to the bottom surface of the phosphor layer 19 has a reflecting surface 25A. The reflecting surface 25A does not follow the surface shape of the DBR layer 17. The reflecting surface 25A is a planar surface having a normal parallel to the normal to the laminate 12, for example. The reflecting layer 25 is a heat dissipator that includes a material including metal such as aluminum, and dissipates the heat generated in the phosphor layer 19 to the outside via the reflecting layer 25. The reflecting layer 25 is provided in contact with the rear surface of the substrate 11, for example, and covers side surfaces of the DBR layer 17 as well as the side surfaces of the phosphor layer 19, for example.

For example, the reflecting layer 25 reflects the light (yellow light Ly or white light Lw) generated by the wavelength conversion performed by the phosphor layer 19 and also reflects the light (blue light Lb) leaking from the DBR layer 17. With this, as illustrated in FIG. 7 and FIG. 8, for example, the reflecting layer 25 reflects the light (yellow light Ly or white light Lw) generated by the wavelength conversion performed by the phosphor layer 19 to the side of the laminate 12. Furthermore, as illustrated in FIG. 7 and FIG. 8, for example, the reflecting layer 25 reflects, to the side of the laminate 12, the blue light Lb that reenters the reflecting layer 25, for example, by being scattered in the phosphor layer 19, while reflecting, to the side of the laminate 12, the light (blue light Lb) leaking from the DBR layer 17. As a result, the light (blue light Lb and yellow light Ly) reflected by the reflecting layer 25 becomes the white light Lw and is outputted from a periphery of the DBR layer 16 to the outside, as illustrated in FIG. 7, for example. The white light Lw is the synthesized light of the blue light Lb and the yellow light Ly. Further, as illustrated in FIG. 8, for example, the white light Lw generated in the phosphor layer 19 is outputted from the periphery of the DBR layer 16 to the outside. It is to be noted that the output of the white light Lw to the outside is not limited to the periphery of the DBR layer 16. For example, an opening may be provided in the electrode pad 15 and the white light Lw may be outputted from the opening.

[Effects]

In the present embodiment, the DBR layer 17 is concave-shaped (or concave-curve-shaped). Consequently, the light leaking from the DBR layer 17 (vertical resonator) is spread by the concave-shaped (or concave-curve-shaped) DBR layer 17. Moreover, in the present embodiment, the reflecting layer 25 is provided at a position opposed to the DBR layer 17 with the predetermined gap in between, and the phosphor layer 19 is provided between the DBR layer 17 and the reflecting layer 25. With this, the light leaking from the DBR layer 17 (vertical resonator) enters the phosphor layer 19 at a wide radiation angle. Furthermore, the light leaking from the DBR layer 17 (vertical resonator) is obliquely reflected by the reflecting layer 25, and therefore, the light reflected by the reflecting layer 25 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at a narrow wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible. Moreover, it is possible to achieve a white light-emitting device that is small in size but has a bright and stable color.

Moreover, in the present embodiment, the reflecting layer 25 has the reflecting surface 25A not following the surface shape of the DBR layer 17. Specifically, the reflecting surface 25A is a planar surface having the normal parallel to the normal to the laminate 12. With this, much of the light leaking from the DBR layer 17 (vertical resonator) is obliquely reflected by the reflecting layer 25, and therefore, much of the light reflected by the reflecting layer 25 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible.

Moreover, in the present embodiment, in a case where the reflecting layer 25 is a heat dissipator that includes the material including the metal, it is possible to diffuse the heat generated in the phosphor layer 19 to the outside via the reflecting layer 25. As a result, it is possible to suppress the decrease in the conversion efficiency of the phosphor layer 19 by the heat storage.

In addition, in the present embodiment, the phosphor layer 19 is in contact with the DBR layer 17. This makes it possible to achieve a white light-emitting device that is small in size but has a bright and stable color.

4. Modification Example of Second Embodiment

In the following, description is given of a modification example of the light-emitting device 20 of the second embodiment.

Modification Example C

FIG. 9 illustrates a modification example of the cross-sectional configuration of the light-emitting device 20. In the present modification example, the light-emitting device 20 includes the resin layer 23 or the air layer 24 between the DBR layer 17 and the phosphor layer 19. That is, the phosphor layer 19 is opposed to the DBR layer 17 with the resin layer 23 or the air layer 24 in between. Even in such a case, similarly to the aforementioned second embodiment, the device miniaturization is possible. Moreover, it is possible to achieve a white light-emitting device that is small in size but has a bright and stable color.

5. Third Embodiment

In the following, description is given of a light-emitting device 30 according to a third embodiment of the present disclosure.

[Configuration]

FIG. 10 illustrates an example of a cross-sectional configuration of the light-emitting device 30. The light-emitting device 30 corresponds to a light-emitting device in which the reflecting layer 25 in the light-emitting device 20 of the aforementioned second embodiment is omitted and that includes a reflecting layer 26 instead. Furthermore, the light-emitting device 30 is configured to be able to perform the optical output from the side surface of the phosphor layer 19. The reflecting layer 26 corresponds to a specific example of the "first reflecting layer" of the present disclosure.

The reflecting layer 26 is so provided as to cover the bottom surface of the phosphor layer 19 and reflect, to the side of the laminate 12, the light leaking from the DBR layer 17 and the light generated by the wavelength conversion performed by the phosphor layer 19. A portion, of the reflecting layer 26, opposed to the bottom surface of the phosphor layer 19 has a reflecting surface 26A not following the surface shape of the DBR layer 17. The reflecting surface 26A is a planar surface having a normal parallel to the normal to the laminate 12, for example. The reflecting layer 26 may be a heat dissipator that includes a material including metal such as aluminum, for example. In this case, the reflecting layer 26 dissipates the heat generated in the phosphor layer 19 to the outside via the reflecting layer 26. The reflecting layer 26 is provided in contact with the bottom surface of the phosphor layer 19.

The reflecting layer 26 reflects the light (yellow light Ly and white light Lw) generated by the wavelength conversion performed by the phosphor layer 19 and also reflects the light (blue light Lb) leaking from the DBR layer 17. With this, as illustrated in FIG. 11 and FIG. 12, for example, the reflecting layer 26 reflects the light (yellow light Ly or white light Lw) generated by the wavelength conversion performed by the phosphor layer 19 to the side of the laminate 12. Furthermore, as illustrated in FIG. 11 and FIG. 12, for example, the reflecting layer 26 reflects, to the side of the laminate 12, the blue light Lb that reenters the reflecting layer 26, for example, by being scattered in the phosphor layer 19, while reflecting, to the side of the laminate 12, the light (blue light Lb) leaking from the DBR layer 17. As a result, as illustrated in FIG. 11, for example, the light (blue light Lb and yellow light Ly) reflected by the reflecting layer 26 becomes the white light Lw, which is the synthesized light of the blue light Lb and the yellow light Ly, and is outputted to the outside from the periphery of the DBR layer 16, for example. Further, as illustrated in FIG. 12, for example, the white light Lw generated by the phosphor layer 19 is output from the periphery of the DBR layer 16 to the outside. Furthermore, as illustrated in FIG. 11, for example, the light (blue light Lb and yellow light Ly) reflected by the reflecting layer 26 propagates through the phosphor layer 19, becomes the white light Lw, which is the synthesized light of the blue light Lb and the yellow light Ly, and is outputted from an end surface of the phosphor layer 19 to the outside. Further, as illustrated in FIG. 12, for example, the light (white light Lw) reflected by the reflecting layer 26 propagates through the phosphor layer 19 and is outputted to the outside from the end surface of the phosphor layer 19.

[Effects]

In the present embodiment, the DBR layer 17 is concave-shaped (or concave-curve-shaped). Consequently, the light leaking from the DBR layer 17 (vertical resonator) is spread by the concave-shaped (or concave-curve-shaped) DBR layer 17. Further, in the present embodiment, the reflecting layer 26 is provided at a position opposed to the DBR layer 17 with the predetermined gap in between, and the phosphor layer 19 is provided between the DBR layer 17 and the reflecting layer 26. With this, the light leaking from the DBR layer 17 (vertical resonator) enters the phosphor layer 19 at a wide radiation angle. Furthermore, the light leaking from the DBR layer 17 (vertical resonator) is obliquely reflected by the reflecting layer 26, and therefore, the light reflected by the reflecting layer 26 enters a portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible. Moreover, it is possible to achieve a white light-emitting device that is small in size and has a bright and stable color.

Moreover, in the present embodiment, the reflecting layer 26 has the reflecting surface 26A not following the surface shape of the DBR layer 17. Specifically, the reflecting surface 26A is a planar surface having the normal parallel to the normal to the laminate 12. With this, much of the light leaking from the DBR layer 17 (vertical resonator) is obliquely reflected, and therefore, much of the light reflected by the reflecting layer 26 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible.

Moreover, in the present embodiment, the light-emitting device 30 is configured to be able to perform the optical output from the side surface of the phosphor layer 19. This makes it possible to take out more light. Therefore, it is possible to achieve a white light-emitting device that is small in size but has a bright and stable color.

Moreover, in the present embodiment, the phosphor layer 19 is in contact with the DBR layer 17. This makes it possible to achieve a white light-emitting device that is small in size but has a bright and stable color.

Moreover, in the present embodiment, in a case where the reflecting layer 26 is a heat dissipator that includes the material including the metal, it is possible to diffuse the heat generated in the phosphor layer 19 to the outside via the reflecting layer 26. As a result, it is possible to suppress the decrease in the conversion efficiency of the phosphor layer 19 by the heat storage.

6. Modification Example of Third Embodiment

In the following, description is given of a modification example of the light-emitting device 30 of the third embodiment.

Modification Example D

FIG. 13 illustrates a modification example of the cross-sectional configuration of the light-emitting device 30. In the modification example, the light-emitting device 30 includes the resin layer 23 or the air layer 24 between the DBR layer 17 and the phosphor layer 19. That is, the phosphor layer 19 is opposed to the DBR layer 17 with the resin layer 23 or the air layer 24 in between. Even in such a case, similarly to the aforementioned third embodiment, the device miniaturization is possible. Moreover, it is possible to achieve a white light-emitting device that is small in size but has a bright and stable color.

7. Fourth Embodiment

In the following, description is given of a light-emitting device 40 according to a fourth embodiment of the present disclosure.

[Configuration]

FIG. 14 illustrates an example of a cross-sectional configuration of the light-emitting device 40. The light-emitting device 40 corresponds to a light-emitting device in which the reflector 21 and the reflecting layer 22 in the light-emitting device 10 of the aforementioned first embodiment are omitted and that includes the reflecting layer 26 instead. Furthermore, the light-emitting device 40 is configured to be able to perform the optical output from the side surface of the phosphor layer 19.

The reflecting layer 26 is provided as to cover the bottom surface of the phosphor layer 19 and reflect, to the side of the laminate 12, the light leaking from the DBR layer 17 and the light generated by the wavelength conversion performed by the phosphor layer 19. A portion, of the reflecting layer 26, opposed to the bottom surface of the phosphor layer 19 has the reflecting surface 26A that does not follow the surface shape of the DBR layer 17. The reflecting surface 26A is a planar surface having the normal parallel to the normal to the laminate 12, for example. The reflecting layer 26 may be a heat dissipator that includes the material including the metal such as aluminum. In this case, the reflecting layer 26 dissipates the heat generated in the phosphor layer 19 to the outside via the reflecting layer 26. The reflecting layer 26 is provided in contact with the bottom surface of the phosphor layer 19.

The reflecting layer 26 reflects, for example, the light (yellow light Ly or the white light Lw) generated by the wavelength conversion performed by the phosphor layer 19 and also reflects the light (blue light Lb) leaking from the DBR layer 17. With this, as illustrated in FIG. 15 and FIG. 16, for example, the reflecting layer 26 reflects, to the side of the laminate 12, the light (yellow light Ly or the white light Lw) generated by wavelength conversion performed by the phosphor layer 19. Furthermore, as illustrated in FIG. 15 and FIG. 16, for example, the reflecting layer 26 reflects, to the side of the laminate 12, the blue light Lb that reenters the reflecting layer 26, for example, by being scattered in the phosphor layer 19, while reflecting, to the side of the laminate 12, the light (blue light Lb) leaking from the DBR layer 17. As a result, as illustrated in FIG. 15, for example, the light (blue light Lb and yellow light Ly) reflected by the reflecting layers 26 and 18 propagates through the phosphor layer 19, becomes the white light Lw, and is outputted to the outside from the end surface of the phosphor layer 19. The white light is the synthesized light of the blue light Lb and the yellow light Ly Further, as illustrated in FIG. 16, for example, the light (white light Lw) reflected by the reflecting layers 26 and 18 propagates through the phosphor layer 19 and is outputted from the end surface of the phosphor layer 19 to the outside.

[Effects]

In the present embodiment, the DBR layer 17 is concave-shaped (or concave-curve-shaped). Consequently, the light leaking from the DBR layer 17 (vertical resonator) is spread by the concave-shaped (or concave-curve-shaped) DBR layer 17. Further, in the present embodiment, the reflecting layer 26 is provided at the position opposed to the DBR layer 17 with the predetermined gap in between, and the phosphor layer 19 is provided between the DBR layer 17 and the reflecting layer 26. With this, the light leaking from the DBR layer 17 (vertical resonator) enters the phosphor layer 19 at the wide radiation angle. Furthermore, the light leaking from the DBR layer 17 (vertical resonator) is obliquely reflected by the reflecting layer 26, and therefore, the light reflected by the reflecting layer 26 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible. Moreover, it is possible to achieve a white light-emitting device that is small in size but has a bright and stable color.

Moreover, in the present embodiment, the reflecting layer 26 has the reflecting surface 26A not following the surface shape of the DBR layer 17. Specifically, the reflecting surface 26A is a planar surface having the normal parallel to the normal to the laminate 12. Consequently, much of the light leaking from the DBR layer 17 (vertical resonator) is obliquely reflected by the reflecting layer 26, and therefore, much of the light reflected by the reflecting layer 26 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible.

Moreover, in the present embodiment, the phosphor layer 19 is in contact with the reflecting layer 18. This makes it possible to achieve a white light-emitting device that is small in size but has a bright and stable color.

Moreover, in the present embodiment, in a case where the reflecting layer 26 is a heat dissipator that includes the material including the metal, it is possible to diffuse the heat generated in the phosphor layer 19 to the outside via the reflecting layer 26. As a result, it is possible to suppress the decrease in the conversion efficiency of the phosphor layer 19 by the heat storage.

8. Modification Example of Fourth Embodiment

In the following, description is given of a modification example of the light-emitting device 20 of the fourth embodiment.

Modification Example E

FIG. 17 illustrates a modification example of the cross-sectional configuration of the light-emitting device 40. In the modification example, the light-emitting device 40 includes the resin layer 23 or the air layer 24 between the reflecting layer 18 and the phosphor layer 19. That is, the phosphor layer 19 is opposed to the reflecting layer 18 with the resin layer 23 or the air layer 24 in between. Even in such a case, similarly to the aforementioned fourth embodiment, the device miniaturization is possible. Moreover, it is possible to achieve a white light-emitting device that is small in size but has a bright and stable color.

9. Fifth Embodiment

In the following, description is given of a light-emitting device 50 according to a fifth embodiment of the present disclosure.

[Configuration]

FIG. 18 illustrates an example of a cross-sectional configuration of the light-emitting device 50. The light-emitting device 50 corresponds to a light-emitting device in which the reflecting layer 26 in the light-emitting device 40 of the aforementioned fourth embodiment is omitted and that includes the reflecting layer 22 instead. Furthermore, the light-emitting device 50 is configured to be able to perform the optical output from the side surface of the phosphor layer 19.

The reflecting layer 22 is disposed at a position opposed to the DBR layer 17 with the predetermined gap in between. The reflecting layer 22 has the reflecting surface 22A not following the surface shape of the DBR layer 17. The reflecting surface 22A is a planar surface having a normal parallel to the normal to the laminate 12, for example. The reflecting layer 22 is configured to include the Bragg reflecting mirror in which the reflectance with respect to the light (blue light Lb) leaking from the DBR layer 17 is greater than the reflectance with respect to the light (yellow light Ly to be described later) generated by the wavelength conversion performed by the phosphor layer 19, for example. With this, as illustrated in FIG. 19, for example, the reflecting layer 22 transmits some of the light (yellow light Ly) generated by the wavelength conversion performed by the phosphor layer 19. Furthermore, as illustrated in FIG. 19, for example, the reflecting layer 22 transmits some of the blue light Lb that reenters the reflecting layer 22, for example, by being scattered in the phosphor layer 19, while reflecting much of the light (blue light Lb) leaking from the DBR layer 17. As a result, the reflecting layer 22 outputs the white light Lw to the outside. The white light Lw is the synthesized light of the blue light Lb and the yellow light Ly. Furthermore, as illustrated in FIG. 19, for example, the light reflected by the reflecting layers 22 and 18 (blue light Lb and yellow light Ly) propagates through the phosphor layer 19, becomes the white light Lw, and is outputted from the end surface of the phosphor layer 19 to the outside. The white light is the synthesized light of the blue light Lb and the yellow light Ly.

It is to be noted that, as illustrated in FIG. 20, for example, the reflecting layer 22 may transmit some of the light (white light Lw) generated by the wavelength conversion performed by the phosphor layer 19 and may reflect much of the light (blue light Lb) leaking from the DBR layer 17. In this case, the reflecting layer 22 is configured to include the Bragg reflecting mirror in which the reflectance with respect to the light (blue light Lb) leaking from the DBR layer 17 is greater than the reflectance with respect to the light (white light Lw) generated by the wavelength conversion performed by the phosphor layer 19, for example. At this time, the reflecting layer 22 outputs the light (white light Lw) generated by the wavelength conversion performed by the phosphor layer 19 to the outside. Furthermore, as illustrated in FIG. 20, for example, the light (white light Lw) reflected by the reflecting layers 22 and 18 propagates through the phosphor layer 19 and is outputted from the end surface of the phosphor layer 19 to the outside.

[Effects]

In the present embodiment, the DBR layer 17 is concave-shaped (or concave-curve-shaped). Consequently, the light leaking from the DBR layer 17 (vertical resonator) is spread by the concave-shaped (or concave-curve-shaped) DBR layer 17. Further, in the present embodiment, the reflecting layer 22 is provided at the position opposed to the DBR layer 17 with the predetermined gap in between, and the phosphor layer 19 is provided between the DBR layer 17 and the reflecting layer 22. With this, the light leaking from the DBR layer 17 (vertical resonator) enters the phosphor layer 19 at a wide radiation angle. Furthermore, the light leaking from the DBR layer 17 (vertical resonator) is obliquely reflected by the reflecting layer 22, and therefore, the light reflected by the reflecting layer 22 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible. Moreover, it is possible to achieve a white light-emitting device that is small in size but has a bright and stable color.

Moreover, in the present embodiment, the reflecting layer 22 has the reflecting surface 22A not following the surface shape of the DBR layer 17. Specifically, the reflecting surface 22A is a planar surface having the normal parallel to the normal to the laminate 12. Consequently, much of the light leaking from the DBR layer 17 (vertical resonator) is obliquely reflected by the reflecting layer 22, and therefore, much of the light reflected by the reflecting layer 22 enters the portion, of the phosphor layer 19, different from the portion through which the light leaking from the DBR layer 17 (vertical resonator) passes. As a result, as compared with the case where the light leaking from the DBR layer 17 (vertical resonator) enters the phosphor layer 19 at the narrow-wide radiation angle, the uniformity of the intensity distribution of the light radiated from the phosphor layer 19 improves. That is, the uniformity of the intensity distribution of the light radiated from the phosphor layer 19 improves even without placing the phosphor layer 19 far away from the DBR layer 17 (vertical resonator). Therefore, the device miniaturization is possible.

Moreover, in the present embodiment, the phosphor layer 19 is in contact with the reflecting layer 18. This makes it possible to achieve a white light-emitting device that is small in size but has a bright and stable color.

10. Modification Example of Fifth Embodiment

In the following, description is given of a modification example of the light-emitting device 50 of the fifth embodiment.

Modification Example F

FIG. 21 illustrates a modification example of a cross-sectional configuration of the light-emitting device 50. In the present modification example, the light-emitting device 50 includes the resin layer 23 or the air layer 24 between the reflecting layer 18 and the phosphor layer 19. That is, the phosphor layer 19 is opposed to the reflecting layer 18 with the resin layer 23 or the air layer 24 in between. Even in such a case, similarly to the aforementioned fifth embodiment, the device miniaturization is possible. Moreover, it is possible to achieve the white light-emitting device that is small in size but has a bright and stable color.

11. Sixth Embodiment

In the following, description is given of a light-emitting apparatus 60 according to a sixth embodiment of the present disclosure.

FIG. 22 illustrates an example of a cross-sectional configuration of the light-emitting apparatus 60. The light-emitting apparatus 60 corresponds to a light-emitting apparatus that includes a plurality of light-emitting devices 10 of the aforementioned first embodiment. Here, the respective light-emitting devices 10 are configured to be able to drive independently of each other, for example. The electrode pads 15 of the respective light-emitting devices 10 are electrically isolated from each other. In the present embodiment, similarly to the aforementioned first embodiment, it is possible to achieve a white light-emitting device that is small in size but has a bright and stable color.

12. Seventh Embodiment

In the following, description is given of a light-emitting apparatus 70 according to a seventh embodiment of the present disclosure.

FIG. 23 illustrates an example of a cross-sectional configuration of the light-emitting apparatus 70. The light-emitting apparatus 70 corresponds to a light-emitting apparatus that includes a plurality of light-emitting devices 20 of the aforementioned second embodiment. Here, the respective light-emitting devices 20 are configured to be able to drive independently of each other, for example. The electrode pads 15 of the light-emitting devices 20 are electrically isolated from each other. In the present embodiment, similarly to the aforementioned second embodiment, it is possible to achieve a white light-emitting device that is small in size but has a bright and stable color.

Although description has been given above of the present disclosure with reference to a plurality of embodiments, the present disclosure is not limited to each of the foregoing embodiments, and various modifications may be made thereto. It is to be noted that the effects described herein are merely illustrative. The effects of the present disclosure are not limited to the effects described herein. The present disclosure may have any effect other than the effects described herein.

Moreover, the present disclosure may have the following configurations, for example.

(1)

A light-emitting device including:

a laminate including an active layer, a first semiconductor layer, and a second semiconductor layer, the first semiconductor layer and the second semiconductor layer sandwiching the active layer in between;

a current confining layer having an opening;

a concave-shaped first reflecting mirror provided on side of the first semiconductor layer and a second reflecting mirror provided on side of the second semiconductor layer, the first reflecting mirror and the second reflecting mirror sandwiching the laminate and the opening in between;

a first reflecting layer disposed at a position opposed to the first reflecting mirror with a predetermined gap in between; and a phosphor layer disposed between the first reflecting mirror and the first reflecting layer, the phosphor layer performing wavelength conversion on light leaking from the first reflecting mirror.

(2)

The light-emitting device according to (1), in which the first reflecting layer includes a reflecting surface not following a surface shape of the first reflecting mirror.

(3)

The light-emitting device according to (2), in which the reflecting surface includes a planar surface having a normal that is parallel to a normal to the laminate.

(4)

The light-emitting device according to any one of (1) to (3), in which the first reflecting layer includes a Bragg reflecting mirror having a reflectance, with respect to the light leaking from the first reflecting mirror, that is greater than a reflectance with respect to light generated by the wavelength conversion performed by the phosphor layer.

(5)

The light-emitting device according to any one of (1) to (4), further including a second reflecting layer disposed between the first reflecting mirror and a phosphor layer, the second reflecting layer reflecting the light generated by the wavelength conversion performed by the phosphor layer.

(6)

The light-emitting device according to any one of (1) to (5), further including a third reflecting layer provided to cover a side surface of the phosphor layer and not to cover a portion, of the reflecting surface, that is opposed to the opening.

(7)

The light-emitting device according to (6), in which the third reflecting layer includes a heat dissipator including a material that includes metal.

(8)

The light-emitting device according to any one of (1) to (3), further including a fourth reflecting layer provided to cover a side surface of the phosphor layer and to reflect, together with the first reflecting layer, the light leaking from the first reflecting mirror and light generated by the wavelength conversion performed by the phosphor layer, toward side of the laminate.

(9)

The light-emitting device according to (8), in which the fourth reflecting layer includes a heat dissipator including a material that includes metal.

(10)

The light-emitting device according to any one of (1) to (5), in which the light-emitting device is configured to be able to perform optical output from a side surface of the phosphor layer.

(11)

The light-emitting device according to (5), in which the phosphor layer is in contact with the second reflecting layer.

(12)

The light-emitting device according to (5), in which the phosphor layer is opposed to the second reflecting layer with a resin layer or an air layer in between.

(13)

The light-emitting device according to any one of (1) to (5), in which the phosphor layer is in contact with the first reflecting mirror.

(14)

The light-emitting device according to any one of (1) to (5), in which the phosphor layer is opposed to the first reflecting mirror with a resin layer or an air layer in between.

(15)

A light-emitting apparatus provided with two or more light-emitting devices, the two or more light-emitting devices each including:

a laminate including an active layer, a first semiconductor layer, and a second semiconductor layer, the first semiconductor layer and the second semiconductor layer sandwiching the active layer in between;

a current confining layer having an opening;

a concave-shaped first reflecting mirror provided on side of the first semiconductor layer and a second reflecting mirror provided on side of the second semiconductor layer, the first reflecting mirror and the second reflecting mirror sandwiching the laminate and the opening in between;

a first reflecting layer disposed at a position opposed to the first reflecting mirror with a predetermined gap in between; and a phosphor layer disposed between the first reflecting mirror and the first reflecting layer, the phosphor layer performing wavelength conversion on light leaking from the first reflecting mirror.

This application claims the benefits of Japanese Priority Patent Application No. 2017-080354 filed on Apr. 14, 2017 with the Japan Patent Office, the entire content of which is incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-emitting device, comprising:
    a laminate that includes an active layer, a first semiconductor layer, and a second semiconductor layer, wherein the active layer is sandwiched between the first semiconductor layer and the second semiconductor layer;
    a current confining layer that includes having an opening;
    a concave-shaped first reflecting mirror on a side of the first semiconductor layer;
    a second reflecting mirror on a side of the second semiconductor layer, wherein the laminate and the opening are sandwiched between the first reflecting mirror and the second reflecting mirror;
    a first reflecting layer at a position opposite to the first reflecting mirror with a gap between the first reflecting layer and the first reflecting mirror; and
    a phosphor layer between the first reflecting mirror and the first reflecting layer, wherein the phosphor layer is configured to perform wavelength conversion on light that leaks from the first reflecting mirror.

2. The light-emitting device according to claim 1, wherein the first reflecting layer includes a reflecting surface that is different in shape from a surface shape of the first reflecting mirror.

3. The light-emitting device according to claim 2, wherein the reflecting surface comprises a planar surface, and
    a normal to the planar surface of the reflecting surface is parallel to a normal to the laminate.

4. The light-emitting device according to claim 1, wherein the first reflecting layer includes a Bragg reflecting mirror,
    a reflectance of the Bragg reflecting mirror is greater than a reflectance with respect to light generated by the wavelength conversion performed by the phosphor layer, and
    the reflectance of the Bragg reflecting mirror is with respect to the light that leaks from the first reflecting mirror.

5. The light-emitting device according to claim 4, further comprising a second reflecting layer between the first reflecting mirror and the phosphor layer, wherein the second reflecting layer is configured to reflect the light generated by the wavelength conversion performed by the phosphor layer.

6. The light-emitting device according to claim 1, further comprising a second reflecting layer to cover a side surface of the phosphor layer and not to cover a portion of a reflecting surface, wherein
    the first reflecting layer includes the reflecting surface, and
    the portion of the reflecting surface is opposite to the opening.

7. The light-emitting device according to claim 6, wherein
    the second reflecting layer comprises a heat dissipator,
    the heat dissipator includes a material, and
    the material includes a metal.

8. The light-emitting device according to claim 1, further comprising a second reflecting layer that covers a side surface of the phosphor layer, wherein
    the second reflecting layer is configured to reflect, together with the first reflecting layer, the light that leaks from the first reflecting mirror and light generated by the wavelength conversion performed by the phosphor layer, toward a side of the laminate.

9. The light-emitting device according to claim 8, wherein
    the second reflecting layer comprises a heat dissipator,
    the heat dissipator includes including a material, and
    the material includes a metal.

10. The light-emitting device according to claim 1, wherein the light-emitting device is configured to perform optical output from a side surface of the phosphor layer.

11. The light-emitting device according to claim 5, wherein the phosphor layer is in contact with the second reflecting layer.

12. The light-emitting device according to claim 5, wherein
    the phosphor layer is opposite to the second reflecting layer, and
    one of a resin layer or an air layer is between the phosphor layer and the second reflecting layer.

13. The light-emitting device according to claim 1, wherein the phosphor layer is in contact with the first reflecting mirror.

14. The light-emitting device according to claim 1, wherein
    the phosphor layer is opposite to the first reflecting mirror, and
    one of a resin layer or an air layer is between the phosphor layer and the first reflecting layer.

15. A light-emitting apparatus, comprising:
    two or more light-emitting devices, wherein each of the two or more light-emitting devices comprises:
        a laminate that includes an active layer, a first semiconductor layer, and a second semiconductor layer, wherein the active layer is sandwiched between the first semiconductor layer and the second semiconductor layer;
        a current confining layer that includes an opening;
        a concave-shaped first reflecting mirror on a side of the first semiconductor layer;
        a second reflecting mirror on a side of the second semiconductor layer, wherein the laminate is sandwiched between the first reflecting mirror and the second reflecting mirror;
        a first reflecting layer at a position opposite to the first reflecting mirror with a gap between the first reflecting layer and the first reflecting mirror; and
        a phosphor layer between the first reflecting mirror and the first reflecting layer, wherein the phosphor layer is configured to perform wavelength conversion on light that leaks from the first reflecting mirror.

* * * * *